(12) United States Patent
Shimada et al.

(10) Patent No.: US 6,353,189 B1
(45) Date of Patent: Mar. 5, 2002

(54) WIRING BOARD, WIRING BOARD FABRICATION METHOD, AND SEMICONDUCTOR PACKAGE

(75) Inventors: Osamu Shimada; Yoshitaka Fukuoka, both of Tokyo; Akihiko Takagi, Saitama-ken; Kenji Sasaoka, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/403,223

(22) PCT Filed: Apr. 16, 1998

(86) PCT No.: PCT/JP98/01748

§ 371 Date: Oct. 15, 1999

§ 102(e) Date: Oct. 15, 1999

(87) PCT Pub. No.: WO98/47331

PCT Pub. Date: Oct. 22, 1998

(30) Foreign Application Priority Data

Apr. 16, 1997 (JP) .............................. 9-099216

(51) Int. Cl.[7] .................................. H05K 1/03
(52) U.S. Cl. ................ 174/255; 174/258; 174/259; 174/262; 174/264; 361/792; 29/830; 29/852
(58) Field of Search ................ 174/255, 260, 174/264, 252, 258, 259, 262; 361/760, 792, 709, 783, 800; 29/852, 830, 846, 850; 257/698, 700, 702, 706

(56) References Cited

U.S. PATENT DOCUMENTS

| 5,048,178 A | | 9/1991 | Bindra et al. |
| 5,457,881 A | * | 10/1995 | Schmidt ........................ 29/852 |
| 5,736,681 A | * | 4/1998 | Yamamoto et al. ......... 174/265 |
| 5,737,833 A | * | 4/1998 | Motomura et al. ............ 29/830 |
| 5,949,654 A | * | 9/1999 | Fukuoka ...................... 361/760 |
| 6,010,769 A | * | 1/2000 | Sasaoka et al. ............. 428/209 |

FOREIGN PATENT DOCUMENTS

| JP | 3-91993 | 4/1991 |
| JP | 4-62993 | 2/1992 |
| JP | 4-267586 | 9/1992 |
| JP | 4-352385 | 12/1992 |
| JP | 5-67696 | 3/1993 |
| JP | 5-198946 | 8/1993 |
| JP | 5-299878 | 11/1993 |
| JP | 7-99397 | 4/1995 |
| JP | 7-170079 | 7/1995 |
| JP | 8-78912 | 3/1996 |
| JP | 8-162559 | 6/1996 |
| JP | 8-204334 | 8/1996 |
| JP | 8-250827 | 9/1996 |
| JP | 8-316686 | 11/1996 |
| JP | 9-23067 | 1/1997 |
| JP | 9-162553 | 6/1997 |
| JP | 9-172243 | 6/1997 |
| JP | 9-191177 | 7/1997 |

* cited by examiner

Primary Examiner—Jeffrey Gaffin
Assistant Examiner—I B Patel
(74) Attorney, Agent, or Firm—Finnegan, Henderson, Farabow, Garrett & Dunner, L.L.P.

(57) ABSTRACT

A wiring board provided with a line 1, a shield pattern 2 formed in parallel with the line 1, a conductor layer 4 formed so as to face the line 1 and the shield pattern 2 through an insulating layer 3, a conductor layer 6 formed so as to face the line 1 and the shield pattern 2 through an insulating layer 5, and conductive pillars 7a, 7b for connecting the conductor layer 4 to the conductor layer 6. The conductive pillars 7a, 7b are connected to each other through the shield pattern 2. In the above structure, by supplying the ground potential to the shield pattern 2, conductor layers 4, 6, and conductive pillars 7a, 7b, an electromagnetic field is blocked in the direction where the line 1 extends over 360° about the line 1.

18 Claims, 25 Drawing Sheets

WIRING BOARD, WIRING BOARD FABRICATION METHOD, AND SEMICONDUCTOR PACKAGE

TECHNICAL FIELD

The present invention relates to wiring boards that have a plurality of wiring layers, and in particular to wiring boards that have less electromagnetic interference. Further, the present invention relates to wiring boards that are excellent in productivity and have a structure appropriate for packaging of high density.

In addition, the present invention relates to a fabrication method of the wiring boards, and in particular to a fabrication method of the wiring boards capable of fabricating wiring boards adequate for packaging of high density with high productivity.

Further, the present invention relates to semiconductor packages, and in particular to semiconductor packages that are less in electromagnetic interference. Still further, the present invention relates to semiconductor packages that can mount a semiconductor element of high degree of integration.

BACKGROUND ART

In recent years, high functionality of wiring boards is in progress. This is because when mounting a semiconductor device such as a semiconductor element or the like on a wiring board, corresponding to demand for high functionality and high integration of a semiconductor device, demand for high integration and high functionality at system level occurs. In order to package such a semiconductor device, there is a necessity to give a wiring board various functions. For instance, corresponding to high densification and multiple pinning of the semiconductor device itself, fine patterning of pitches connecting between a semiconductor device and a wiring board mounting thereof, and fine patterning of wiring pitches (L/S) of the wiring board itself are in demand.

A conventional printed wiring board, due to its fabrication method, has a disadvantage that its wiring area becomes smaller due to through holes disposed for interlayer connection. This is because when through holes for interlayer connection are formed, a layer other than necessary one is also bored. Thus bored holes make less the wiring area for the other wiring layers. To solve such problems, there has been proposed a wiring board in which only the layers necessary for interlayer connection can be selectively bored.

As one of such wiring boards, there is an IVH board in which multiplication of layers is accomplished by stacking boards of which interlayer connection is formed by the use of through holes as identical as the conventional wiring board. For such an IVH board, each layer requires a step of boring, in addition after stacking them a step of further boring is necessary, thus resulting in an extremely expensive wiring board. In such type wiring board in which interlayer connection is furnished by the use of through holes, there was a problem that due to plating a thickness of conductor of a wiring layer becomes thick accordingly it is difficult to obtain fine patterning of wiring. On the other hand, there has been proposed another type of wiring boards in which pillars (protruded electrode) are formed on a wiring layer by the use of conductive resin, and interlayer connection of a plurality of wiring layers is furnished by letting the conductive pillars pierce through a prepreg.

In these wiring boards, compared with the conventional wiring boards, the steps of boring, plating and polishing are made unnecessary for furnishing interlayer connection, and only necessary portions can be furnished with interlayer connections. Accordingly, in addition to improvement the degree of freedom of design, productivity can be improved.

Further, compared with connection with through holes, interlayer connection can be implemented without decreasing an area that can package electronic parts. In addition, since the plating is unnecessary, thickening of a wiring layer can be avoided, and fine patterning of wiring can be implemented easily.

However, in such type wiring boards in which interlayer connection is implemented by the use of the conductive pillars, there were following problems.

First, when with a wiring board that has multiple layers furnished by the use of conductive pillars as a core material further wiring layers are stacked on the outside thereof, there is a problem that reliability of the wiring boards is difficult to maintain. The conductive pillars that are formed by the use of conductive paste are such hard as to pierce through a prepreg. Accordingly, there was a problem that via lands and conductive pillars at portions of interlayer connection of the core material are tend to deform. According to the observation of the inventors, this is because that since insulating layers of the core material and external layer material are composed of approximately identical materials, due to heating during a step of stacking the layer of insulating resin constituting the core material softens to deform due to pressure during the step of stacking. When such deformation occurs, reliability of interlayer connection is deteriorated. Accordingly, conditions in the step of stacking such as temperature, pressure or the like are required to control rigorously, resulting in restricting productivity.

Further, so far, there was another problem that the conductive pillars disposed on base material and core material, because the thickness of insulating layers is thick, tend to be broad in diameter. When a diameter is made small, there is a case where sufficiently reliable interlayer connection due to the conductive pillars can not be obtained. In order to secure reliability of connection, process conditions must be rigorously controlled.

The present invention is made out to solve such problems as described above.

That is to say, an object of the present invention is to provide wiring boards having a structure that in addition to being able to cope with packaging of high density, is high in productivity and reliability.

Further, another object of the present invention is to provide a fabrication method of wiring boards having a structure that in addition to being able to cope with high density packaging, is high in productivity and reliability.

Still another object of the present invention is to provide semiconductor packages that are capable of packaging a semiconductor element of high degree of integration and of high operating speed.

Now, as electronic instruments become smaller, for instance smaller high frequency oscillators are in demand. To cope with such a demand, in oscillators of high frequency, dielectric boards thereon signal lines (strip lines) are formed are stacked, on this multi-layered wiring board, other than the signal lines, other wiring pattern is disposed, and various kinds of electronic parts are mounted.

Further, when transmission lines are disposed on a surface of a stacked dielectric board and other wiring pattern is formed within the stacked dielectric board (disposed inside) signal radiation is generated to be likely to adversely affect on the other wiring pattern. In addition, external electromagnetic noise may adversely affect to induce malfunction of wiring circuits including transmission lines, semiconductor packages, and electronic instruments.

To cope with such problems, as essential configurations are shown with sections in FIG. 26 and FIG. 27, respectively, there is a trial in which while a pair of ground layers 92a and 92b sandwich a transmission line 91 or a via hole 99 from up and down directions, further on the sides of both side surfaces of a transmission line 91 or a via hole 99, shield patterns 93a and 93b (one turn type) are disposed to electrically connect to the ground layers 92a and 92b.

That is, by constituting so as to surround a transmission line 91 from up and down directions and right and left directions, the transmission line 91 is secured in shielding (Japanese Patent Laid-open Publication No. Hei 5-299878). Incidentally, in FIG. 26 and FIG. 27, reference numeral 94 denotes a dielectric layer (insulating layer).

However, in the case of a shield structure such as described above being employed, ordinarily, although the thickness thereof is in the range of from several tens $\mu$m to 100 $\mu$m, due to gaps that the dielectric layer forms and formation of closed circuits, the transmission line 91 can not be sufficiently shielded. Therefore, by influencing to each other with other transmission lines and electronic parts within a wiring board, stable circuit operation can not be secured.

As a remedy for this, there has been proposed a configuration in which the transmission line 91 is sandwiched from up and down directions by a pair of ground layers 92a and 92b, and further these ground layers 92a and 92b are electrically connected by a plurality of vertical grounding conductors (via hole connection) at the surrounding areas thereof (Japanese Patent Laid-open Publication No. Hei 8-78912).

That is, the unnecessary radiation of the up and down directions of the transmission line 91 is shielded by a pair of ground layers 92a and 92b that sandwich the line 91 from the up and down directions, and the unnecessary radiation on the side of the side surfaces of the transmission line 91 is shielded by the vertical grounding conductors.

When such a configuration that surrounds the transmission line 91 from the up and down and left and right directions is taken, adverse influence due to the transmission line can be reduced. However, still there remains a problem that will be described in the following. That is, in the wiring board of this kind, compact circuit design and high performance is in demand. To cope with this demand, wiring of high density or fine patterning of wiring is in progress. As a result of this, complicated processing operation, fine and high precision processing or the like is in demand. In other words, upon connecting the ground layers 92a and 92b by vertical ground conductors, on corresponding positions where holes are necessary to be bored in advance by the use of a drill or the like, and inside these holes conductive films are required to form. However, the aforementioned boring operation with a drill or the like is restricted to holes of diameter of approximately several hundreds $\mu$m or more. Thereby, wiring of high density is largely restricted. Further, the boring operation being restricted to holes of diameter of approximately several hundreds $\mu$m or more disturbs not only high densification of L/S of wiring and fine patterning of wiring but also influences largely on yield to ensue rising of the cost.

The present invention is made out to cope with the aforementioned situation. An object of the present invention is to provide wiring boards that can be fabricated with simple processes and are furnished with a transmission line having shielding property high in reliability and fabrication methods thereof. In addition, another object of the present invention is to provide semiconductor packages provided with such wiring board.

DISCLOSURE OF THE INVENTION

To solve such problems, the present invention adopts constitutions as will be described in the following. A wiring board of the present invention comprises a transmission line, a shielding means that is disposed so as to encircle the surroundings of the transmission line along the transmission line and shields the transmission line, and an insulating layer disposed between the transmission line and the shielding means.

The aforementioned shielding means may have a plurality of conductive pillars disposed along the transmission line.

Further, the conductive pillars may be disposed piercing through the insulating layer.

Further, the conductive pillars may be disposed so that a central axis thereof is approximately vertical to an extending direction of the transmission line. When a line that is disposed approximately in parallel with a surface of a wiring board is shielded, such a constitution is only necessary to adopt.

Still further, the conductive pillars may be disposed so that a central axis thereof is approximately in parallel with an extending direction of the transmission line. When a line (for instance, a portion of interlayer connection) disposed approximately vertical to a surface of a wiring board is being shielded a constitution like this is only necessary to adopt.

In addition, a wiring board of the present invention comprises a transmission line that has a first surface and a second surface, a first conductor layer that faces to the first surface of the transmission line, a second conductor layer that faces to the second surface of the transmission line, a shielding means consisting of conductive material and connecting the first conductor layer and the second conductor layer, and an insulating layer insulating the transmission line from the first conductor layer, the second conductor layer, and the shielding means.

The shielding means may have a plurality of conductive pillars that is disposed along the transmission line and connects the first conductor layer and the second conductor layer by piercing through the insulating layer.

Further, the insulating layer may comprise a first insulating layer disposed on the first surface side of the transmission line and a second insulating layer disposed on the second surface side of the transmission line. The conductive pillars may have a first portion that pierces through the first insulating layer and a second portion that pierces through the second insulating layer. In this case, the first portion and the second portion of the conductive pillars may be connected through a via land or may be connected directly without through the via land.

Further, the shielding means may have a third conductor layer that connects the first conductor layer and the second conductor layer. For instance, the insulating layer may have a groove disposed along the transmission line, and the third conductor layer may be disposed to cover at least the surface of the groove to connect the first conductor layer and the second conductor layer.

A wiring board of the present invention comprises a first insulating layer having a first surface and a second surface, a first conductive pillar disposed piercing through the first insulating layer, a second conductive pillar disposed so as to encircle the surroundings of the first conductive pillar while piercing through the first insulating layer, a second insulating layer that has a first surface and a second surface, and is stacked with the first insulating layer so that the first surface thereof and the second surface of the first insulating layer face are faced to each other, a third conductive pillar disposed so as to connect with the first conductive pillar while piercing through the second insulating layer, and a fourth conductive pillar that encircles the surroundings of the third conductive pillar and is disposed so as to connect with the second conductive pillar while piercing through the second insulating layer.

On the second surface of the second insulating layer a conductive pad that is disposed connected with the first conductive pillar may be comprised further.

On the second surface of the second insulating layer, a conductor pattern (shield pattern) that is disposed so as to encircle the conductor pad to connect commonly the second conductive pillars may be further comprised.

In addition, the first conductive pillars and the third conductive pillars may be connected through via-lands and wiring layers, or may be connected directly.

The semiconductor package of the present invention is a semiconductor package in which a semiconductor element is packaged on a wiring board, wherein the wiring board comprises a transmission line disposed on an inner layer of the wiring board, a shielding means that is disposed along the transmission line to encircle the surroundings of the transmission line and shields the transmission line, and an insulating layer disposed between the transmission line and the shielding means.

Further, a wiring board of the present invention comprises a signal wiring incorporated within an insulating layer, a pair of ground layers incorporated and disposed on both sides so as to sandwich the signal wiring, and at least a layer of shield pattern that is incorporated between the pair of ground layers on the side surface sides of the signal wiring and connected electrically to the ground layers, wherein electrical connection of the shield pattern to the ground layers may be implemented by the use of conductive bumps that pierce through the insulating layers at a plurality of places.

Further, the wiring board may comprise a transmission line incorporated within an insulating layer, a pair of ground layers disposed on both surface sides so as to sandwich the transmission line, and a plurality of layers of shield pattern that is disposed between the pair of ground layers on the side surface sides of the transmission line and connected electrically to the ground layers.

Mutual electrical connection at least between shield patterns may be implemented by the use of conductive bumps that are disposed so as to engage on surfaces facing to each other and pierce through the insulating layers.

In the present invention, a conductive bump that due to compression pierces through an insulating layer to connect electrically between shield patterns that face to each other or between a shield pattern and a conductor layer for grounding is conductive composite or conductive metal that can be prepared by the following means. For instance, on a portion of copper foil where a shield pattern is to be formed or on a prescribed position of a shield pattern, by the use of printing method with a relatively thick metal mask, a protrusion of high aspect ratio is formed. This protrusion is desirable to form in approximate cone. Height, diameter and distribution of the conductive pillars may be appropriately set according to constitution of the piercing conductor portions to be formed.

In concrete, they are determined considering final arrangement and structure of conductive bumps that pierce through an insulating layer. For instance, in the case of a synthetic resin based sheet being a B stage epoxy resin layer containing a glass cloth, when pressurized in from both surface sides, a height of approximately 80 to 200% of a thickness of the B stage epoxy resin layer is desirable, and when pressurized in from one surface side, a height of approximately 180 to 400% of the B stage epoxy resin layer is desirable. In addition, the conductive pillars can be arranged by the use of stamp method in which a mask that is formed by boring holes of approximately 0.05 to 0.3 mm on prescribed positions of a plate of stainless steel of a thickness of, for instance, approximately 5 mm, is placed on all the surface of a casing, and conductive composite (paste) accommodated in the casing is pressurized to extrude from the holes of the mask.

In the wiring board of the present invention, electrical connection between a signal wiring disposed incorporated within an insulating layer and ground layer and shield pattern is implemented by the use of conductive bumps piercing through the insulating layer at a plurality of positions. That is, conductor layers facing to each other are connected with fine conductive bumps and reinforced in connection due to penetration of the insulating layer therethrough. Accordingly, in addition to realization of the fine shield pattern, it can work as a wiring board that is given a shielding property of high reliability.

Further, electrical connection of a signal line disposed incorporated in an insulating layer to a ground layer and a shield pattern is implemented at a plurality of positions, and shield patterns themselves are connected by conductive bumps that pierce through the insulating layer in engaging manner to the facing surface. That is, facing conductor layers are connected over approximately whole circumference with fine conductive bumps and moreover with a form reinforced by the penetrated insulating. Accordingly, in addition to realization of fine shield patterns, it can work as a wiring board that is given a shielding property of high reliability.

While materializing simplification of fabrication steps, wiring boards that realize the aforementioned fine shield patterns and are given shielding property of high reliability can be provided with high yield.

Next, wiring boards that are high in reliability and can be made small and thin will be described.

A wiring board of the present invention comprises a first insulating layer having a first hardness, a second insulating layer that is stacked with the first insulating layer and has a second hardness smaller than the first hardness, and first conductive pillars disposed pierced through the second insulating layer.

The wiring board may further comprise a third insulating layer that is stacked with the first insulating layer or the second insulating layer and has a third hardness smaller than the first hardness, and second conductive pillars disposed pierced through the third insulating layer.

Further, the wiring board may further comprise first via-lands sandwiched between the first insulating layer and the second insulating layer, and second via-lands disposed so as to face the first via-lands through the second insulating layer, wherein the first conductive pillar may connect the first via-land and the second via-land by piercing through the second insulating layer.

The first conductive pillars like this may be formed of conductive resin.

The hardness of the first conductive pillars is desirable to be smaller than the first hardness.

The second insulating layer may employ resin material.

The third insulating layer may employ resin material having flexibility. As such material, for instance, polyimide film, BCB film or the like can be cited.

The first insulating layer may be ceramic material, glass, a metallic plate covered by insulating material or the like.

The wiring board may further comprise third conductive pillars that are disposed independently electrically from the first conductive pillars and connected thermally with the metallic plate.

The first insulating layer may have fine unevenness on the surface thereof, and the second insulating layer may be made so as to engage with the unevenness of the first insulating layer. By thus implementing, joining strength between the first insulating layer and the second insulating layer can be improved.

Thermal conductivity of the first insulating layer may be designed to be larger than that of the second insulating layer. By thus implementing, due to the first insulating layer, heat generated by electronic parts mounted thereon can be dissipated more effectively.

A wiring board of the present invention comprises a first insulating layer having a first hardness that has a first surface and a second surface and is provided with first via-lands on the first surface or the second surface, a plurality of second insulating layers having a second hardness smaller than the first hardness that are disposed so as to sandwich the first insulating layer, second via-lands disposed so as to face the first insulating layer through the second insulating layer, and first conductive pillars that pierce through the second insulating layer to connect the first via-lands and the second via-lands.

A wiring board of the present invention comprises a first insulating layer consisting of ceramic material, a second insulating layer that is stacked with the first insulating layer and consisting of resin material, first via-lands sandwiched between the first insulating layer and the second insulating layer, second via-lands disposed so as to face the first via-lands through the second insulating layer, and conductive pillars that connect the first via-lands and the second via-lands.

A fabrication method of wiring boards of the present invention comprises a step of forming a first wiring layer that has first via-lands on a first surface of a first insulating layer having a first hardness, a step of forming on the first via-lands conductive pillars that have a third hardness smaller than the first hardness and are approximately conical, a step of disposing so as to face any one of a conductor layer and a board that is furnished with a second wiring layer having second via-lands on a first surface, and a first surface of the first insulating layer through an uncured prepreg, and a step of pressing the conductor layer or the board and the first insulating layer so as to connect electrically the conductive pillars and the second via-lands and so as to cure the prepreg.

A semiconductor package of the present invention is a semiconductor package in which a semiconductor element is mounted on a wiring board, wherein the wiring board comprises a first insulating layer having a first hardness, a second insulating layer that is stacked with the first insulating layer and has a second hardness smaller than the first hardness, and conductive pillars pierced through the second insulating layer.

The semiconductor package here includes not only one type that mounts a single semiconductor element on a wiring board but also so called MCM (Multi-Chip Module) in which a plurality of semiconductor elements and other electronic parts are mounted on one board.

A wiring board of the present invention is a multi-layered wiring board in which a plurality of wiring layers and a plurality of insulating layers are stacked, wherein interlayer connection between the wiring layers that face through an insulating layer is implemented by the use of conductive pillars, and at least one layer of the insulating layers is consisting of ceramic material. The wiring board may comprise a first insulating layer having a first surface and a second surface and a first hardness, a first wiring layer that is disposed on the first surface of the first insulating layer and has first via-lands, a second insulating layer having a second hardness smaller than the first hardness that has a first surface and a second surface and is disposed on the first wiring layer so as for the first surface thereof and the first wiring layer to face, a second wiring layer that is disposed on the second surface of the second insulating layer and has second via-lands disposed so as to face the first via-lands, and conductive pillars connecting the first via-lands and the second via-lands by piercing through the second insulating layer.

The wiring board may further comprise a third wiring layer that is disposed on the second surface of the first insulating layer and has third via-lands, a third insulating layer that has a first surface and a second surface and is disposed on the first insulating layer so as for the first surface thereof and the third wiring layer to face to each other, a fourth wiring layer that is disposed on the second surface of the second insulating layer and has fourth via-lands that face the third via-lands, and the conductive pillars connecting the third via-lands and the fourth via-lands by piercing through the third insulating layer.

A wiring board of the present invention comprises a first insulating layer having a first hardness, a second insulating layer that is stacked with the first insulating layer and has a second hardness smaller than the first hardness, first via-lands sandwiched between the first insulating layer and the second insulating layer, second via-lands disposed to face the first via-lands through the second insulating layer, and conductive pillars connecting the first via-lands and the second via-lands by piercing through the second insulating layer.

The wiring board of the present invention may further comprises a first insulating layer having a first surface and a second surface and a first hardness, a first wiring layer that is disposed on the first surface of the first insulating layer and has first via-lands, a second insulating layer having a second hardness smaller than the first hardness that has a first surface and a second surface and is disposed on the first insulating layer so that a first surface thereof and the first wiring layer face to each other, a second wiring layer that is disposed on the second surface of the second insulating layer and has second via-lands disposed to face the first via-lands, and conductive pillars connecting the first via-lands and the second via-lands by piercing through the second insulating layer.

The wiring board may further comprise a third wiring layer that is disposed on the second surface of the first insulating layer and has third via-lands, a third insulating layer that has a first surface and a second surface and is disposed on the first insulating layer so that the first surface thereof and the third wiring layer face to each other, a fourth wiring layer that is disposed on the second surface of the second insulating layer and has fourth via-lands that face to the third via-lands, and the conductive pillars connecting the third via-lands and the fourth via-lands by piercing through the third insulating layer.

As the first insulating layer, for instance, ceramic material such as alumina, aluminum nitride and mullite, glass-ceramic material, glass, metallic plate of which surface is covered by insulating material can be employed. As metallic material, for instance, copper or copper based alloy, aluminum or the like can be employed.

The second insulating layer may be constituted of resin material. Further, insulating resin can be impregnated into base material such as glass cloth to employ.

As the second insulating layer, for instance thermoplastic resin material such as polycarbonate resin, polysulfone resin, thermoplastic polyimide resin, tetrafluoro-polyethylene resin, hexafluoropolypropylene resin, poly-etheretherketone resin, for instance thermosetting resin material such as epoxy resin, bismaleimide type polyimide resin, bismaleido type triazine resin, polyimide resin, denatured polyimide resin, phenolic resin, polyester resin, melamine resin, polyphenylene ether based resin, and prepreg in which these resins are impregnated into glass cloth or the like can be cited. In addition, for instance, crude gum sheet of such as butadiene rubber, buthyl rubber, natural rubber, neoprene rubber, silicone rubber or the like can be employed.

These material of insulating resins can be synthetic resin alone, but can contain insulating fillers such as inorganic substance and organic substance, further can be suitably employed by combining with reinforcement material such as glass cloth or mat, organic synthetic fiber sheet, paper or the like.

As the second insulating layer, insulating resin material having flexibility such as polyimide based resin film, polyester based resin film, or polytetrafluoroethylene can be employed.

When the flexible resin material such as described above is employed as the second insulating material, the second insulating layer may be multi-layered, and between the flexible resin material and the first insulating layer, thermo-setting resin such as epoxy denatured polyimide may be disposed.

Conductive pillars that are employed for interlayer connection of a wiring board of the present invention may be constituted of conductive resin having a third hardness smaller than the first hardness. In addition, the conductive pillars may be formed to have an approximately conical shape. In order to pierce through a prepreg effectively, the conductive pillars are desirable to be in isotropic cross section.

By taking such a constitution, when interlayer connection is implemented by the use of conductive pillars, since stress exerted in a normal direction of the conductive pillars can be supported by stiffness of the first insulating layer, reliability of the interlayer connecting portion being enhanced.

Such conductive pillars may be formed by the use of screen printing of conductive paste in which for instance conductive fine particles are mixed and dispersed with and in a binder. Further, solvent, coupling agent, additives or the like can be added as necessity arises.

As binder material, thermosetting resins and thermoplastic resins such as urea resin, melamine resin, phenolic resin, resorcinol resin, epoxy resin, poly-urethane resin, vinyl acetate resin, poly-vinyl alcohol resin, acrylic resin, vinyl urethane resin, silicone resin, α-olefin maleic acid anhydride resin, poly-amide resin, and polyimide resin, and mixture thereof can be employed.

As conductive fine particles (filler), fine particles or ultra-fine particles of such as Au, Ag, Cu, solder, Ni, carbon or the like can be mixed with or dispersed in the aforementioned binder. In addition to these conductive materials, one that is coated of its surface by the aforementioned conductive material can be employed. Further, a plurality of conductive materials may be combined to employ.

As solvent, for instance, dioxane, benzene, hexane, toluene, solvent naphtha, industrial gasoline, cellosolve acetate, ethyl cellosolve, buthyl cellosolve acetate, buthyl-carbinol acetate, dimethylformaldehyde, dimethylacetamide, N-methyl pyrrolidone or the like can be used as demand arises.

Further, interlayer connection of a plurality of wiring layers of the present wiring board may be implemented by combining the conductive pillars and other means for interlayer connection. For instance, interlayer connection with the conductive pillars may be combined with various kinds of interlayer connecting means such as through holes, laser vias, photo vias, or the like.

The conductive pillars furnished to the wiring board of the present invention, without restricting to electrical connection of a plurality of wiring layers, may be employed as so-called thermal via for thermally connecting over a plurality of wiring layers.

That is, the wiring board of the present invention may further comprise second conductive pillars that are disposed independently electrically from the first conductive pillars and thermally connected with the metallic plate.

The first insulating layer may have fine unevenness on the surface thereof, and the second insulating layer may engage with the unevenness of the first insulating layer.

For instance, for the first insulating layer ceramic material may be employed, and for the second insulating layer resin material such as prepreg may be employed. By implementing thus, at the same time with establishment of the interlayer connection due to the conductive pillars, fine holes or unevenness on a surface of ceramic material are filled by the prepreg. However hard the ceramic material that is generally a sintered body is polished, there remains fine holes or unevenness on the surface thereof. When stacking thin films of ceramics to each other, such unevenness or holes are required to fill. However, in the wiring board of the present invention, by the use of resin material of semi-cured state, the unevenness and holes on the surface of ceramics are filled automatically. Thereby, productivity can be improved. In addition, due to an anchoring effect of the unevenness on the surface of the ceramics to the resin layer, a plurality of insulating layers themselves can be connected strongly.

Thermal conductivity of the first insulating layer may be larger than that of the second insulating layer. The ceramic material is larger in thermal conductivity than the resin material, accordingly heat due to for instance a semiconductor element or the like can be dissipated in a plane direction of the wiring board through the wiring board.

In the above, though a constitution in which the first insulating layer and the second insulating layer are stacked together is described, the second insulating layer can be disposed on both surfaces of the first insulating layer. Further, such a stacked body can be employed as a core material to form a further multi-layered body. Even in such a case, in a wiring board of the present invention, due to adoption of the insulating layer of larger hardness, over the whole surface of the wiring board, uniform pressure can be applied. Therefore, productivity and reliability of connection due to conductive pillars can be improved.

That is, a wiring board may comprise a first insulating layer having a first hardness that has a first surface and a second surface and is provided with first via-lands on either one of the first surface or the second surface, a plurality of second insulating layers having a second hardness smaller than the first hardness that is disposed so as to sandwich the first insulating layer, second via-lands disposed so as to face the first insulating layer through the second insulating layer, and conductive pillars connecting the first via-lands and the second via-lands by piercing through the second insulating layer.

The wiring board of the present invention may comprise a first insulating layer consisting of ceramic material, a second insulating layer that is stacked with the first insulating layer and consisting of resin material, first via-lands sandwiched between the first insulating layer and the second insulating layer, second via-lands disposed so as to face the first via-lands through the second insulating layer, and conductive pillars connecting the first via-lands and the second via-lands.

A fabrication method of wiring boards of the present invention is one that fabricates the wiring boards of the present invention such as those described above.

The fabrication method of wiring boards of the present invention comprises a step of forming a first wiring layer having first via-lands on a first surface of a first insulating layer having a first hardness, a step of forming on the first via-lands conductive pillars that have a third hardness smaller than the first hardness and are approximately in cone, a step of disposing so as to face either one of a conductor layer or a board in which a second wiring layer having the second via-lands on the first surface, and a first surface of the first insulating layer through prepreg of non-cured state, and a step of pressing the conductor layer or the board and the first insulating layer so that the conductive pillars and the second via-lands are connected electrically and the prepreg is cured.

As described above, in the wiring board of the present invention, the second insulating layer may be disposed without restricting on one surface of the first insulating layer but on both surfaces thereof.

A semiconductor package of the present invention is one that mounts a semiconductor element and a semiconductor device such as MCM or the like on such a wiring board as described above.

That is, a semiconductor package of the present invention is one that packages a semiconductor element on a wiring board, wherein the wiring board comprises a first insulating layer having a first hardness, a second insulating layer that is stacked with the first insulating layer and has a second hardness smaller than the first hardness, first via-lands sandwiched between the first insulating layer and the second insulating layer, second via-lands disposed so as to face the first via-lands through the second insulating layer, and conductive pillars connecting the first via-lands and the second via-lands by piercing through the second insulating layer.

By adopting a constitution like this, in the wiring board of the present invention, reliability of interlayer connection due to conductive pillars can be improved. In addition to thinning of the thickness of the second insulating layer, the diameter of the conductive pillars can be made small. Accordingly, a wiring board that is thin and suitable for packaging of high density can be manufactured.

Further, in a semiconductor element of which degree of integrity is particularly high and operational frequency is high, securing of thermal dissipation path is of importance. However, the conductive pillars that are an interlayer connecting means furnished to the wiring board of the present invention can be employed as thermal via to improve property of heat dissipation. In particular, since ceramic material and metallic material have thermal conductivity larger than resin material, for instance, prepreg or the like, by thermally connecting a semiconductor element and a first insulating layer by conductive pillars, a semiconductor device of high performance can be packaged. Further, conductive pillars that are employed as thermal via may be disposed independently from the conductive pillars that are employed for interlayer connection of signal wiring. Still further, the first insulating layer may be constituted of a metallic plate concurrently working as a ground plane so as to employ commonly between thermal via and signal wiring of ground system.

That is, the wiring board of the present invention is a multi-layered wiring board in which a plurality of wiring layers and a plurality of insulating layers are stacked, wherein interlayer connection between the wiring layers that face through the insulating layer is implemented by conductive pillars, and at least one of the insulating layers is consisting of ceramic material.

A wiring board of the present invention comprises a first insulating layer having a first hardness, a second insulating layer that is stacked with the first insulating layer and has a second hardness smaller than the first hardness, first via-lands sandwiched between the first insulating layer and the second insulating layer, second via-lands disposed so as to face the first via-lands through the second insulating layer, and conductive pillars connecting the first via-lands and the second via-lands by piercing through the second insulating layer.

A wiring board of the present invention comprises a first insulating layer that has a first surface and a second surface and a first hardness, a first wiring layer that is disposed on the first surface of the first insulating layer and has first via-lands, a second insulating layer that has a first surface and a second surface, is disposed on the first insulating layer so that the first surface thereof and the first wiring layer face to each other and has a second hardness smaller than the first hardness, a second wiring layer that is disposed on the second surface of the second insulating layer and has second via-lands disposed so as to face the first via-lands, and conductive pillars connecting the first via-lands the second via-lands by piercing through the second insulating layer.

The wiring board may further comprise a third wiring layer that is disposed on the second surface of the first insulating layer and has third via-lands, a third insulating layer that has a first surface and a second surface and is disposed on the first insulating layer for the first surface thereof and the third wiring layer to face to each other, a fourth wiring layer that is disposed on the second surface of the second insulating layer and has fourth via-lands facing the third via-lands, and the conductive pillars connecting the third via-lands and the fourth via-lands by piercing through the third insulating layer.

As the first insulating layer, ceramic material such as alumina, aluminum nitride, mullite or the like, glass ceramic material, glass, metallic plate the surface of which is covered by insulating material or the like can be employed. As metallic material, copper or copper based alloy, aluminum or the like may be employed.

The second insulating layer may be constituted of resin material. Insulating resin may impregnate a base material such as glass cloth.

As the second insulating layer, for instance thermoplastic resin material such as poly-carbonate resin, poly-sulfonic resin, thermoplastic polyimide resin, tetrafluoro polyethylene resin, hexafluoro polypropylene resin, polyetheretherketone resin or the like, for instance thermosetting resin material such as epoxy resin, bismaleimide type polyimide resin, bismaleimide type triazine resin, polyimide resin, denatured polyimide resin, phenolic resin, polyester resin, melamine resin, polyphenylene ether resin, BT resin or the like, and prepreg in which the above members are impregnated into glass cloth can be cited.

Further, for instance, crude gum sheet such as butadiene gum, buthyl gum, natural gum, neoprene gum, silicone gum or the like may be employed.

These resin materials can be employed alone or may contain inorganic or organic insulating filler, further can be suitably employed by combining with reinforcement material such as glass cloth or mat, organic synthetic fiber sheet or matte, paper or the like.

As the second insulating layer, flexible insulating resin material such as polyimide based resin film, polyester based resin film, or polytetrafluoroethylene can be employed.

When the aforementioned flexible resin material is employed as insulating material of the second insulating layer, the second insulating layer can be made in multi-layers and between the flexible resin material and the first insulating layer, for instance thermosetting resin such as epoxy denatured polyimide may be disposed.

The conductive pillars that are employed for layer connection of the wiring board of the present invention may be constituted of conductive resin having a third hardness smaller than the first hardness. The conductive pillars may be formed in approximate cone. In order to penetrate the prepreg effectively, the cross section of the conductive pillars are desirable to be isotropic.

By adopting such a constitution, when interlayer connection is implemented by the use of the conductive pillars, stress exerting in a normal direction of the conductive pillars can be supported by stiffness of the first insulating layer to result in improvement of reliability of interlayer connecting portion.

As the conductive pillars as described above, for instance conductive paste that is prepared by mixing and dispersing conductive fine particles in a binder may be coated by the use of the screen printing method. In addition, solvent, coupling agent, additives or the like can be added as demand arises.

As the binder material, thermosetting resins and thermoplastic resins such as urea resin, melamine resin, phenolic resin, resorcinol resin, epoxy resin, polyurethane resin, vinyl acetate resin, poly vinyl alcohol resin, acrylic resin, vinyl urethane resin, silicone resin, α-olefin maleic acid anhydride resin, polyamide resin, polyimide resin or the like, or mixture thereof can be employed.

As the conductive fine particles (filler), fine particles, ultra-fine particles or the like of such as Au, Ag, Cu, solder, Ni, carbon or the like are mixed with or dispersed in the aforementioned binder to employ. In addition to these conductor materials, one on which surface these conductive materials are formed may be employed. Further, a plurality of conductive substances may be combined.

As the solvent, for instance, dioxane, benzene, hexane, toluene, solvent naphtha, industrial gasoline, cellosolve acetate, ethyl cellosolve, buthyl cellosolve acetate, buthyl carbinol acetate, dimethylformaldehyde, dimethylacetamide, N-methyl pyrrolidone or the like can be used as demand arises.

Further, interlayer connection of a plurality of wiring layers of the present wiring board may be implemented by combining the conductive pillars and other means for interlayer connection. For instance, interlayer connection with the conductive pillars may be implemented together with various kinds of interlayer connecting means such as through holes, laser vias, photo vias, or the like.

The conductive pillars furnished to the wiring board of the present invention is not restricted to electrical connection of a plurality of wiring layers but may be employed as so called thermal vias for thermal connection over a plurality of wiring layers.

That is, the wiring board of the present invention may further comprise second conductive pillars that are disposed independent electrically from the first conductive pillars and connected thermally with the metallic plate.

In addition, the first insulating layer may have fine unevenness on the surface thereof, and the second insulating layer may engage with the unevenness of the first insulating layer.

For instance, for the first insulating layer, for instance ceramic material may be employed, and for the second insulating layer resin material such as prepreg may be employed. By implementing thus, at the same time with establishment of the interlayer connection due to the conductive pillars, fine holes or unevenness on the surface of ceramic base material are filled by the prepreg. In general, however hard the ceramic material that is a sintered body is polished there remain fine holes or unevenness on the surface thereof. When stacking a thin film thereof, such unevenness or holes are required to be filled. However, in the wiring board of the present invention, by the use of resin material of semi-cured state, the unevenness and holes on the surface of ceramics are filled automatically. Thereby, productivity can be improved. In addition, due to anchoring effect of the unevenness on the surface of the ceramics to the resin layer, a plurality of insulating layers themselves can be connected strongly.

Further, thermal conductivity of the first insulating layer may be set larger than that of the second insulating layer. The ceramic material is larger in thermal conductivity than the resin material, accordingly heat due to for instance a semiconductor element or the like can be dissipated in a plane direction of the wiring board through the wiring board.

Incidentally, in the above, though a constitution in which a first insulating layer and a second insulating layer are stacked together is described, the second insulating layers can be disposed on both surfaces of the first insulating layer. Further, such a stacked body can be employed as a core material to form a further multi-layered wiring board. Even in such a case, in the wiring board of the present invention, due to adoption of the insulating layer of larger hardness, over the whole surface of the wiring board, uniform pressure can be applied. Therefore, productivity and reliability of connection due to conductive pillars can be improved.

That is, the wiring board of the present invention may comprise a first insulating layer that has a first and second surfaces, is provided with first via-lands on either one of the first surface or second surface and has a first hardness, a plurality of second insulating layers that are disposed so as to sandwich the first insulating layer and have a second hardness smaller than the first hardness, second via-lands disposed so as to face the first insulating layer through the second insulating layer, and conductive pillars connecting the first via-lands and the second via-lands by piercing through the second insulating layer.

Further, the wiring board of the present invention may comprise a first insulating layer consisting of ceramic material, a second insulating layer that is stacked with the first insulating layer and consisting of resin material, first via-lands sandwiched between the first insulating layer and the second insulating layer, second via-lands disposed to face the first via-lands through the second insulating layer, and conductive pillars connecting the first via-lands and the second via-lands.

A fabrication method of wiring boards of the present invention is one that fabricates such wiring boards as described above.

That is, a fabrication method of wiring boards of the present invention comprises a step of forming a first wiring layer having first via-lands on a first surface of a first insulating layer that has a first hardness, a step of forming conductive pillars that have a third hardness smaller than the first hardness and are in approximate cone on the first via-lands, a step of disposing so as to face either one of a conductor layer and a board on which first surface a second wiring layer having second via-lands is disposed to the first surface of the first insulating layer through non-cured prepreg, and a step of pressing the conductor layer or the board and the first insulating layer so that the conductive pillars and the second via-lands are connected electrically and the prepreg is cured.

As described above, in the wiring board of the present invention, the second insulating layer may be disposed without restricting on one surface of the first insulating layer but on both surfaces thereof.

A semiconductor package of the present invention is as described above one that packages semiconductor element and semiconductor device such as MCM or the like on such a wiring board.

That is, in a semiconductor package of the present invention that mounts a semiconductor element on a wiring board, the wiring board comprises a first insulating layer having a first hardness, a second insulating layer that is stacked on the first insulating layer and has a second hardness smaller than the first hardness, first via-lands that are sandwiched between the first insulating layer and the second insulating layer, second via-lands disposed so as to face the first via-lands through the second insulating layer, and conductive pillars connecting the first via-lands and the second via-lands by piercing through the second insulating layer.

Further, in semiconductor elements of which degree of integrity is particularly high and operational frequency is high, securement of thermal dissipation path is of importance. However, the conductive pillars that are an interlayer connecting means and furnished to the wiring board of the present invention can be employed as thermal via to improve property of heat dissipation. In particular, since ceramic material and metallic material have thermal conductivity larger than resin material, for instance, prepreg or the like, by thermally connecting the semiconductor element and the first insulating layer by conductive pillars, semiconductor devices of high performance can be packaged. Further, the conductive pillars that are employed as thermal vias may be disposed independently from the conductive pillars that are employed for interlayer connection of signal wiring. Still further, the first insulating layer may be constituted of a metallic plate that works concurrently as a ground plane to employ commonly between thermal via and signal wiring of ground system.

That is, the wiring board of the present invention is a multi-layered wiring board in which a plurality of wiring layers and a plurality of insulating layers are stacked, wherein interlayer connection between the wiring layers that face to each other through the insulating layer is implemented by conductive pillars, and at least one of the insulating layers is consisting of ceramic material.

For instance, the wiring boards of the present invention typical in core ceramic printed wiring boards, when compared with, for instance, conventional D/C boards (thin film/ceramic board), have the following advantages.

First, how hard the surface of ceramics is polished, due to being sintered body, there remain fine holes on the surface thereof. Each one layer of thin film formed by the use of sputtering or evaporation method is thin. Accordingly, there occurs a necessity of a step of filling unevenness of grain level on the surface of ceramics. However, in the wiring board of the present invention, due to resin such as prepreg in B stage and pressure during stacking, holes are filled automatically by stacking.

In addition, when a wiring layer of thin film is formed on a ceramic board, one conductor layer and one insulating layer are stacked alternatively one on one to form a wiring board. As a result of this, its cost becomes expensive. The wiring board of the present invention can be fabricated according to a fabricating method of the conventional printed wiring board. Accordingly, fabricating cost can be reduced remarkably.

Further, when the wiring layers of thin film are formed on a ceramic board, front and rear surfaces of ceramic base material are furnished with the wiring layer of thin film only one by one, or only on one surface, the wiring layer of thin film can be formed. In contrast to this, in the wiring boards of the present invention, wiring layers of thin film can be formed on front and rear surfaces simultaneously. Accordingly, the wiring boards can be made in multi-layer easily and improved in productivity. Moreover, the wiring boards of the present invention, since hardness of base material or core material is high, can be compressed uniformly over the whole surface of the wiring board. As a result of this, reliability of connection due to the conductive pillars becomes high. This is particularly remarkable when surface area of the wiring board is large.

When compared the fabricating cost from such a view point between a wiring board in which wiring layer of thin film is formed on a ceramic board and a wiring board of the present invention, as a whole, the fabricating cost of the present wiring board can be reduced to from one several tenths to one several hundredths.

Next, wiring boards of the present invention and ones that are obtained by piling up flexible boards consisting of ceramic base material will be compared.

When a layer to be added to base material is a flexible wiring board and this is stacked on a ceramic board that is a core, some connection means is necessary therebetween. In the present invention, a ceramic layer and a flexible board can be connected through a prepreg. Thus, it can be said a structure of high productivity.

Further, at most only two layers of flexible wiring board can be added to the core ceramics. In the wiring boards of the present invention, however, by combining a prepreg and a flexible board as necessity arises, further multiplication of layers can be carried out easily.

In addition, a resin board such as prepreg is less expensive than a flexible wiring board. Accordingly, a wiring board as a whole can be reduced in its cost.

Even when compared with other build-up type board, if a resin board is employed as core material, there remains a problem of structural strength. Further, in the present invention, by employing material of high thermal conductivity such as ceramics, metal or the like as core material, thermal conductivity in lateral direction is also improved. Thereby, heat can be dissipated uniformly from the whole wiring board.

In addition, since ceramics has high permittivity, a bypass condenser that lowers impedance of power source system or variation of power source or the like can be incorporated in a core ceramic board of a wiring board of the present invention. Accordingly, the wiring board of the present invention can cope with the demand of high function and multi-function of the wiring board.

Further, as other examples of the present invention, the following inventions can be cited.

1. A wiring board, comprising:
    a transmission line;
    two sheets of shielding plates disposed above and below the transmission line along the transmission line; and
    conductive member that is disposed on both sides of the transmission line along the transmission line and connects electrically between the two sheets of shielding plates;
    wherein the conductive member is disposed between the two sheets of shielding plates so that a plurality of substantially conical conductive pillars alternates each direction thereof up and down in a direction vertical to the surface of the shielding plate; and
    an insulating layer is disposed between the transmission line and the shielding plates, and the conductive member.

2. The wiring board as set forth in 1, wherein the conductive member has a shape in which adjacent substantially conical conductive pillars contact themselves at surface portion thereof.

3. The wiring board as set forth in 1, wherein the conductive member has a shape in which adjacent substantially conical conductive pillars are spaced themselves with a prescribed distance apart.

4. A wiring board, comprising:
    a transmission line;
    two sheets of shielding plates disposed above and below the transmission line along the transmission line;
    an insulating layer disposed between the transmission line and the shielding plate; and
    conductive member disposed on both sides of the transmission line along the transmission line to connect electrically between the two sheets of shielding plates;
    wherein the conductive member is formed in such a way that on corresponding positions of the two sheets of shielding plates a plurality of substantially conical conductive pillars are disposed in one row, in a state sandwiching the insulating layer between the two sheets of shielding plates, the two sheets of shielding plates are pressed to make the substantially conical conductive pillars pierce through the insulating layer, and thereby at least between a tip end of the substantially conical conductive pillar and the shielding plate facing the tip end are made to contact to form.

5. The wiring board as set forth in 4, wherein the conductive member has a shape in which adjacent aforementioned conductive pillars contact themselves at surface portion thereof.

6. The wiring board as set forth in 4, wherein the conductive member has a shape in which the adjacent substantially conical conductive pillars are spaced themselves with a prescribed distance apart.

7. A fabrication method of a wiring board, comprising the steps of:
    forming a plurality of substantially conical conductive pillars on a portion where a shield pattern of a first conductor plate is destined to be formed;
    forming a plurality of substantially conical conductive pillars on a portion where a shield pattern of a second conductor plate is destined to be formed;
    pressing while sandwiching a board intermediate between the first conductor plate and the second conductor plate to connect electrically between the first conductor plate and the second conductor plate through the substantially conical conductive pillars; and
    curing the board intermediate.

8. A fabricating method of a wiring board, comprising the steps of:
    forming a plurality of substantially conical conductive pillars on a portion where a shield pattern of a first conductor plate is destined to be formed;
    forming a plurality of substantially conical conductive pillars on a portion where a shield pattern of a second conductor plate is destined to be formed;
    pressing while sandwiching a first board intermediate between the first conductor plate and the second conductor plate to connect electrically between the first conductor plate and the second conductor plate through the substantially conical conductive pillars;
    forming a transmission line and a shield pattern on the second conductor plate;
    forming a plurality of substantially conical conductive pillars on the shield pattern;
    forming a plurality of substantially conical conductive pillars on a portion where a shield pattern of a third conductor plate is destined to be formed;
    pressing while sandwiching a second board intermediate between the first board intermediate and the third conductor plate to connect electrically the shield pattern and the third conductor plate through the substantially conical conductive pillars; and
    curing the board intermediate.

9. The fabricating method as set forth in 8:
    wherein the step of forming substantially conical conductive pillars on the conductor plates is a step of disposing the substantially conical conductive pillars themselves closely.

10. The fabricating method as set forth in 8:
    wherein the step of forming substantially conical conductive pillars on the conductor plates is a step of disposing the substantially conical conductive pillars themselves with a prescribed distance apart.

11. A wiring board, comprising:
    a first conductor layer having a first surface and a second surface;
    a second conductor layer facing the first surface of the first conductor layer through an insulating layer;

a third conductor layer facing the second surface of the first conductor layer through an insulating layer; and a fourth conductor layer formed spaced from the first conductor layer from the second conductor layer to the third conductor layer.

12. A wiring board, comprising:

a transmission line having a first surface and a second surface;

a first conductor layer facing the first surface of the transmission line;

a second conductor layer facing the second surface of the transmission line;

an insulating layer having a groove disposed along the transmission line and insulating the transmission line from the first conductor layer and the second conductor layer; and a third conductor layer that covers at least a surface of the groove and connects the first conductor layer and the second conductor layer.

13. A wiring board, comprising:

a first board having a first hardness;

a second board stacked directly with the first board and having a second hardness smaller than the first hardness; and a conductive pillar disposed piercing the second board.

14. The wiring board as set forth in 13, wherein the second boards are directly stacked on both surfaces of the first board.

15. The wiring board as set forth in 13, wherein the first board is a ceramic board and the second board is a resin board.

16. The wiring board as set forth in 13, wherein the first board is consisting of glass.

17. The wiring board as set forth in 13, wherein the first board is a metallic plate of which surface is covered by an insulating substance.

18. The wiring board as set forth in 17, further comprising:

a conductive pillar that is disposed electrically independent from the first conductive pillar and connected thermally with the metallic plate.

19. The wiring board as set forth in 13, wherein the first board has fine unevenness on the surface thereof, and the second board is engaged with the unevenness of the first board.

20. The wiring board as set forth in 13, wherein thermal conductivity of the first board is larger than that of the second board.

21. A semiconductor package in which a semiconductor element is packaged on a wiring board:

wherein the wiring board comprises;

a first board on one surface of which a heat dissipation pad for use of a semiconductor chip is formed;

a second board stacked directly on a surface opposite to the surface where the heat dissipation pad of the first board is formed and having thermal conductivity higher than the first board; and a thermal conductive pillar thermally connecting the heat dissipation pad and the second board while piercing through the first board.

22. A fabricating method of a wiring board, comprising the steps of:

forming a first wiring layer having a first via-land on a first surface of a first board having a first hardness;

forming on the first via-land a substantially conical conductive pillar having a third hardness smaller than the first hardness;

disposing a second board disposed a second wiring layer having a second via-land on a first surface and having a second hardness smaller than the first hardness to face a first surface of the first board through uncured prepreg; and pressing the first board, the prepreg and the second board in thickness direction to make the conductive pillar pierce through the prepreg, thereby connecting electrically the first via-land the second via-land.

BEST MODES FOR CARRYING OUT THE INVENTION (Embodiment 1)

Figure 1:
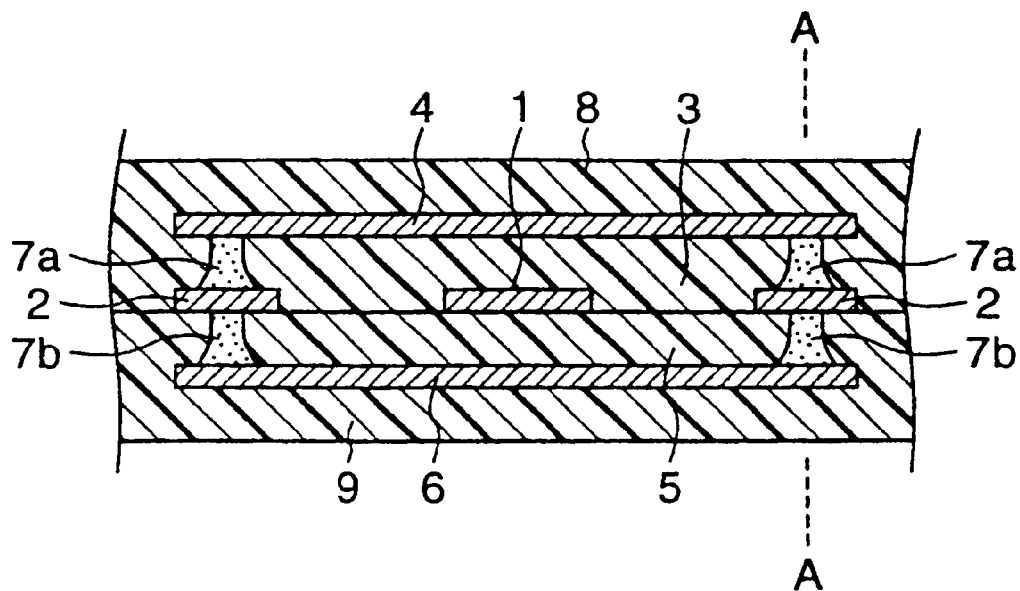
FIG. 1 is a cross-section showing schematically an example of a constitution of a wiring board of the present invention.

FIG. 1 is a cross section showing schematically an example of a constitution of a wiring board of the present invention.

This wiring board comprises a line 1, a shield pattern 2 disposed approximately in parallel with the line 1, a conductor layer 4 disposed so as to face the line 1 and the shield pattern 2 through an insulating layer 3, a conductor layer 6 disposed so as to face the line 1 and the shield pattern 2 through an insulating layer 5, and conductive pillars 7a and 7b that connect the conductor layer 4 and the conductor layer 6. In this example, the conductive pillars 7a and 7b are connected through the shield pattern 2. Insulating layers 8 and 9 are also insulating layers and through them wiring layers that are omitted from showing in the figure are insulated.

By patterning copper foil, the line 1, the conductor layers 4 and 6 and the shield pattern 2 are formed. The conductive pillars 7a and 7b are formed of conductive resin and disposed while piercing through the insulating layers 3 and 5 consisting of prepreg, respectively.

Figure 2:
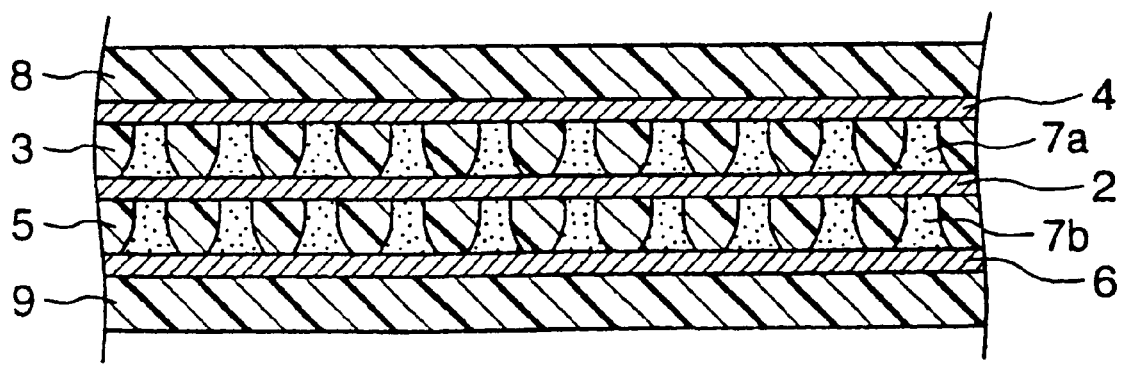
FIG. 2 is a diagram showing schematically a cross section structure in A—A direction of a wiring board of the present invention illustrated in FIG. 1.

FIG. 2 is a diagram showing schematically an A—A cross-section structure of a wiring board of the present invention illustrated in FIG. 1.

Thus, in a wiring board of the present invention, the conductive pillars 7a and 7b that connect the conductor layer 4 and the conductor layer 6 are disposed along the line 1. By adopting such a constitution and by applying a ground voltage to the shield pattern 2, the conductor layers 4 and 6, and the conductive pillars 7a and 7b, along an extending direction of the line 1, over 360° in the surroundings thereof electromagnetic field can be shielded. In particular, shielding between the shield pattern 2 and the conductor layers 4 and 6 that is difficult in the conventional wiring board can be implemented by the conductive pillars 7a and 7b. Accordingly, unnecessary radiation caused by a signal travelling the line 1 can be shielded. Thereby, electromagnetic interference, and electromagnetic interference (EMI) to the line 1 from other lines of the wiring board and external noise sources can be prevented from occurring. Further, in the wiring board of the present invention, a line within the wiring board can be shielded. Accordingly, degree of freedom when designing wiring board can be improved. For instance, a plurality of terminals within a wiring board can be connected without employing a coaxial cable while shielding. In addition, the wiring board of the present invention, when applied to semiconductor device such as a semiconductor package, MCM (Multi-Chip Module) or the like can cope with high-speed operation to result in improvement of reliability.

In the above example, conductive pillar 7a and conductive pillar 7b are connected through a shield pattern 2. However, they can be connected directly without through the shield pattern.

Incidentally, connection to the line 1 and connection to the shield pattern 2, the conductor layers 4 and 6, and the conductive pillars 7a and 7b may be implemented by the use of various kinds of interlayer connections such as conductive pillars, through holes or the like.

Figure 28:
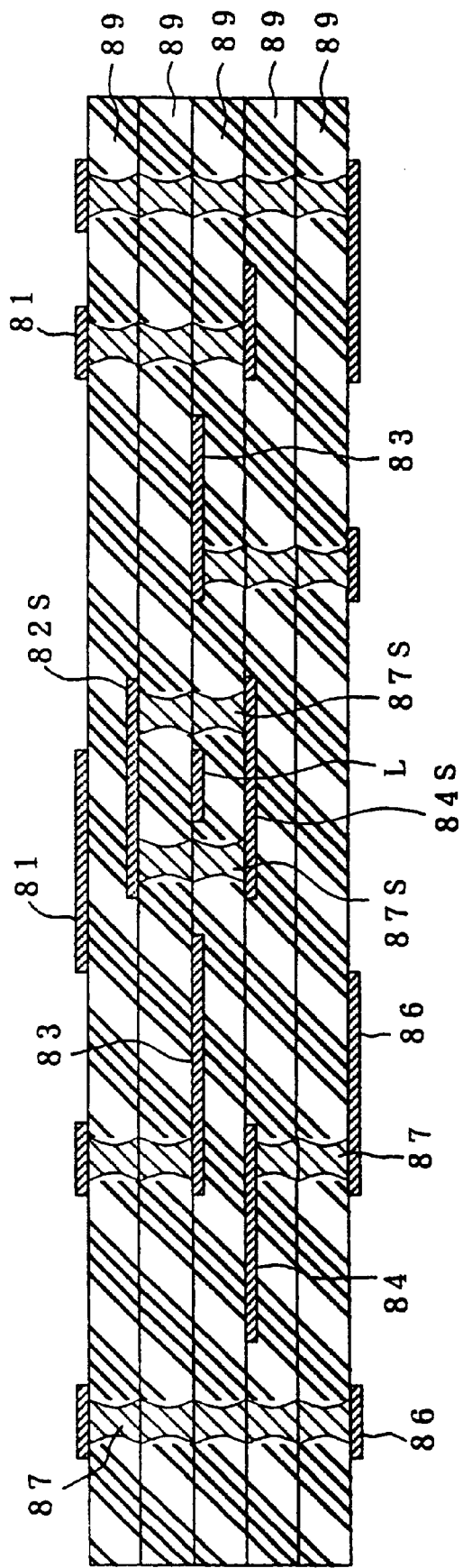
FIG. 28 is a diagram showing schematically an example of a constitution of a wiring board of the present invention.

FIG. 28 is a diagram showing schematically an example of a constitution of a wiring board of the present invention.

Here, an example of a constitution of a wiring board as a whole that is furnished with the aforementioned shielding structure will be described. In this example, conductive pillars that are employed for interlayer connection are directly connected without through via-land.

This wiring board is a multi-layered wiring board provided with six layers of wiring layers 81, 82, 83, 84, and 86. Each wiring layer is insulated by a prepreg 89 in which insulating layer resin such as BT resin or glass epoxy is impregnated in glass cloth or the like.

Such direct connection between conductive pillars themselves that does not employ via-land may be implemented by the use of such an etching selectivity that when such as copper foil is etched to pattern etching liquid of copper does not etch conductive resin. Accordingly, copper of lower portion of conductive pillars is etched to remove. Thereafter, to bottom surfaces (or top surfaces) of the exposed conductive pillars, conductive pillars may be connected further. Without employing the via-land, space can be acquired and degree of integration can be improved.

Conductive pillars 87 and 87S disposed piercing through prepregs 89 to implement interlayer connection between the respective wiring layers.

Then, a transmission line L belonging to for instance a wiring layer 83 is shielded by surrounding the circumference of an extending direction of the line over 360° by conductor layers 82S and 84S and conductive pillars 87S. Thereby, unnecessary radiation from for instance the line L can be prevented from adversely affecting other lines within the wiring board, electronic parts mounted on the wiring board or the outside of the wiring board. In addition, adverse effect to the line L from these portions can be also eliminated.

In this case, the conductive pillars 87 are directly connected without through via-land. That is, there is no land where a plurality of conductive pillars is piled up in series.

In general, a diameter of the land is designed to have a size larger than that of an area filled by conductive paste. Accordingly, an effective area of wiring is restricted. Further, due to existence of the land, there are many interfaces between conductive paste and copper foil, as a result of this, reliability is also likely to be adversely affected.

In contrast, the structure of the present invention, when compared with the conventional structure that has land, can improve wiring density by eliminating the land. Further, in the case of there being land, since the land and the conductive paste are utterly different in their physical property and characteristics, there are interfaces therebetween. However, by eliminating the land there is not any interface that is different in their physical property and characteristics. Accordingly, reliability of interlayer connection can be improved.

Further, as will be described later, two insulating layers on the side of, for instance, wiring layer 86 may be formed by the use of material such as ceramics or metal of larger hardness than that of prepreg 89. Thereby, reliability of interface connection due to the conductive pillars can be heightened. In addition, heat dissipation property of the wiring board can be improved.

(Embodiment 2)

Figure 3:
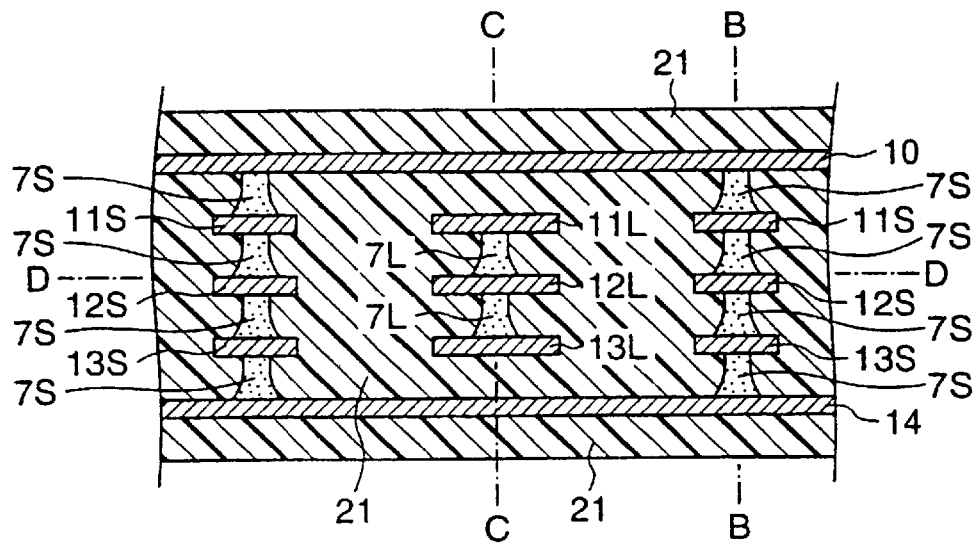
FIG. 3 is a cross section showing schematically another example of a constitution of a wiring board of the present invention.
Figure 4:
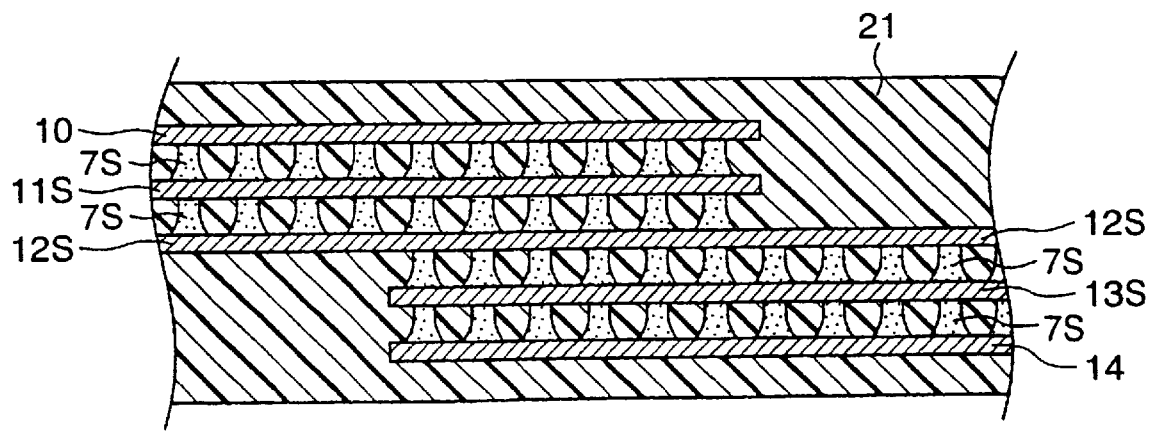
FIG. 4, FIG. 5 and FIG. 6 are diagrams showing schematically cross-sections in different directions of the wiring board of FIG. 3.
Figure 5:
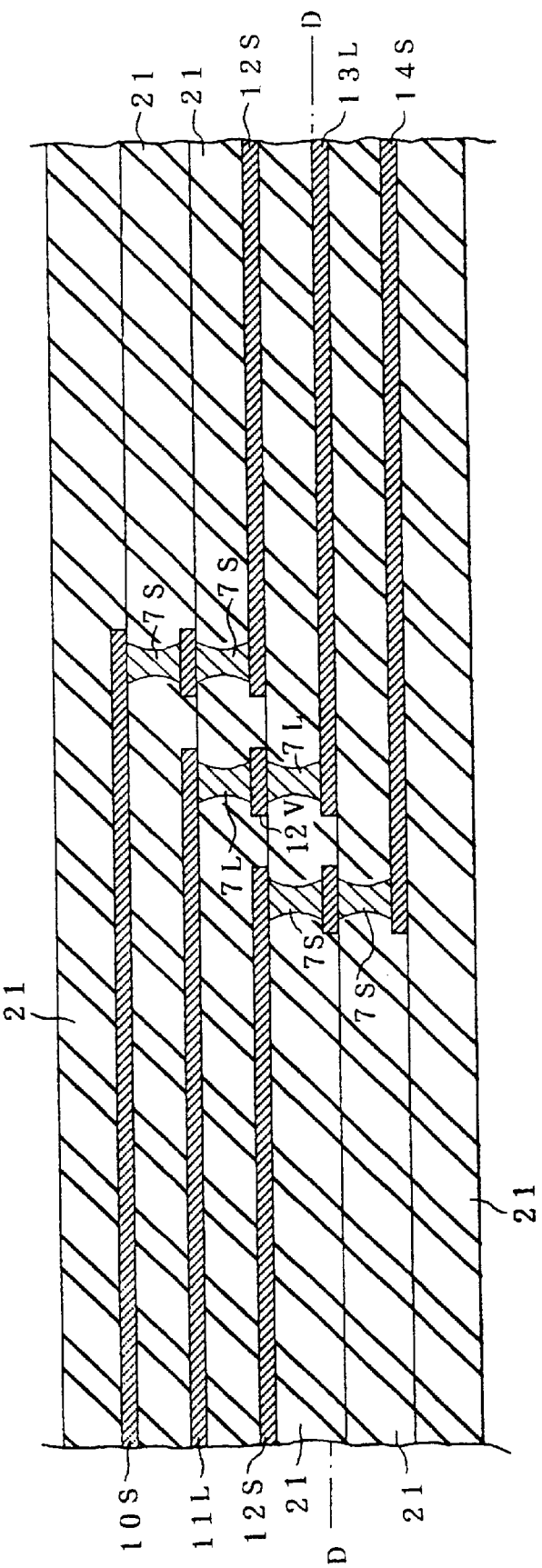
Figure 6:
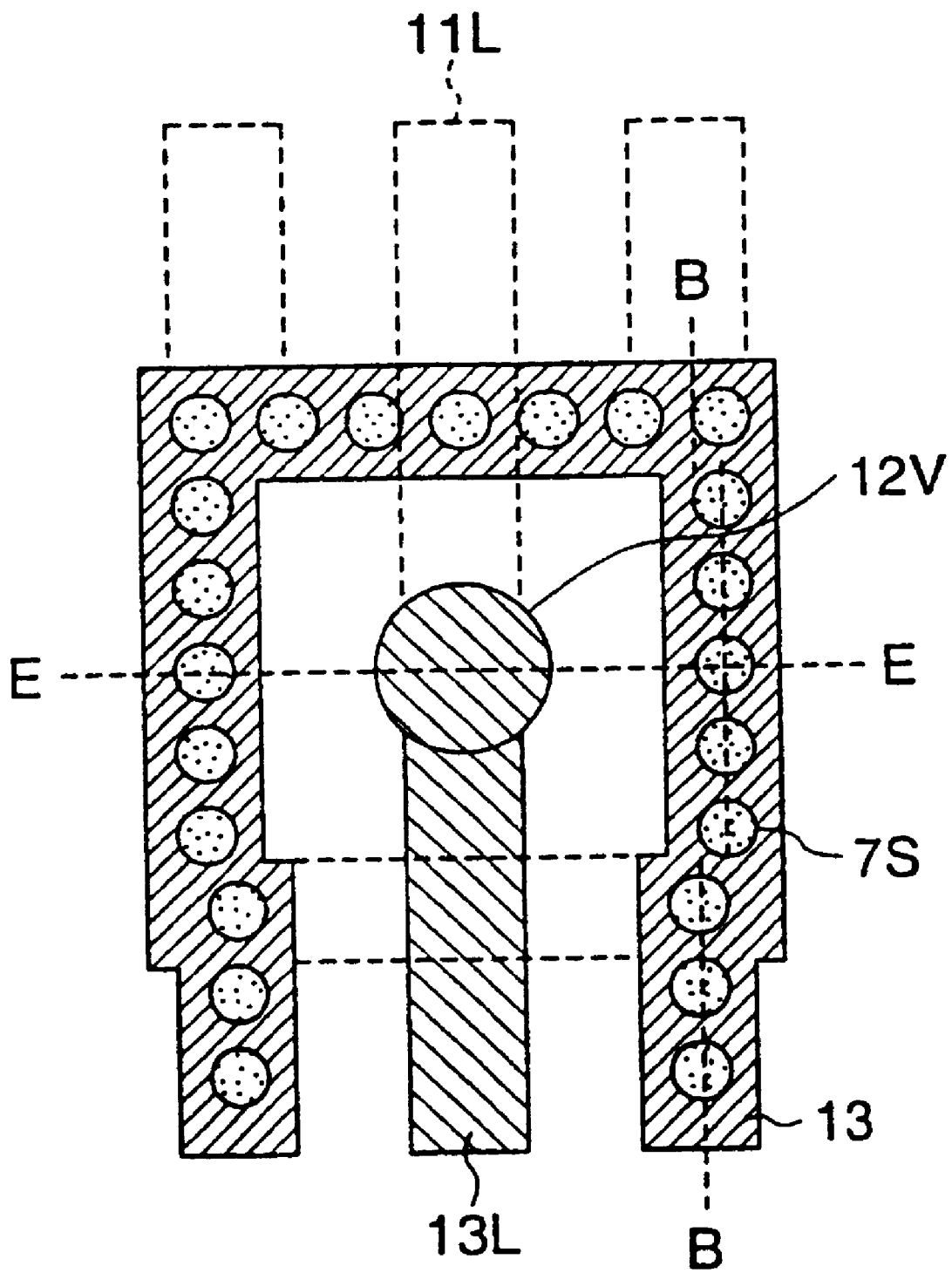

FIG. 3 is a cross section showing schematically another example of a constitution of a wiring board of the present invention, and FIGS. 4, 5 and 6 are diagrams showing schematically cross section structures in other directions of the wiring board of FIG. 3. FIG. 4 shows a BB cross section of FIG. 3, FIG. 5 shows a CC cross-section and FIG. 6 shows a DD cross-section, respectively. By the way, FIG. 3 is an EE cross section of FIG. 6.

In this wiring board, a line 11L and a line 13L formed on different wiring layers are connected by conductive pillars 7L and surroundings thereof is shielded by conductor layers 10S and 14S, shield patterns 11S, 12S and 13S and conductive pillars 7S.

The respective wiring layers are insulated by insulating layers 21 consisting of prepreg or the like, and the conductive pillars 7L and 7S pierce through the insulating layers to implement interlayer connection of the respective conductor layers. Namely, interlayer connection between the line 11L and the line 13L is implemented by the use of the conductive pillars 7L that are disposed piercing through the insulating layer 21 and a via-land 12V (cf. FIGS. 3 and 4). Further, interlayer connection between a conductor layer 10S and a conductor layer 14S is implemented by the conductive pillars 7S and shield patterns 11S, 12S and 13S (FIGS. 3 and 5).

In the present invention, by adopting such constitution, lines disposed over a plurality of wiring layers within a multi-layered wiring board can be also effectively shielded.

Further, as to the extending direction of the line consisting of the conductive pillars 7L and a via-land 12V that carry out interlayer connection between the line 11L and the line 13L, center axes of the conductive pillars 7S for use of shield are in approximate parallel to each other. By encircling the circumference of the lines that are implemented for interlayer connection of such wiring board by the conductive pillars 7S, not only the lines in parallel with a surface of the wiring board but also interlayer connection portions can be shielded. Together with implementation of interlayer connection to connecting terminals of electronic parts such as a semiconductor element or the like on the surface of the wiring board by the use of conductive pillars 7L, by implementing shielding of this interlayer connection portion as described above, the lines of the wiring board can be shielded up to the vicinity of the terminals of the packaged electronic parts. Accordingly, electromagnetic interference of semiconductor package, MDM or the like can be effectively prevented from occurring.

(Embodiment 3)

Here, a fabrication method of a wiring board of the present invention will be described. In the wiring board of the present invention, conductive pillars that are employed for shielding lines, interlayer connection between lines or the like can be formed simultaneously.

Figure 7A:
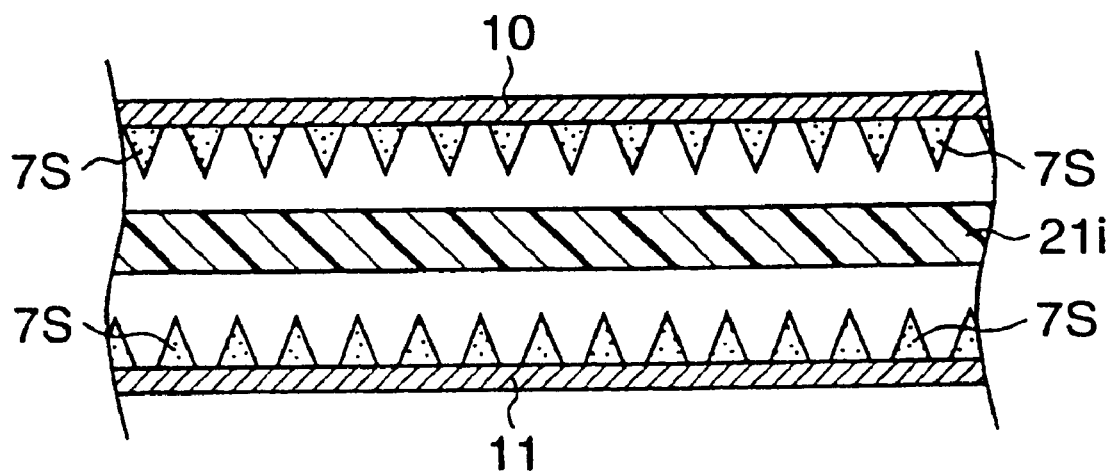
FIG. 7A and FIG. 7B are diagrams for explaining an example of a fabrication method of a wiring board of the present invention.
Figure 7B:
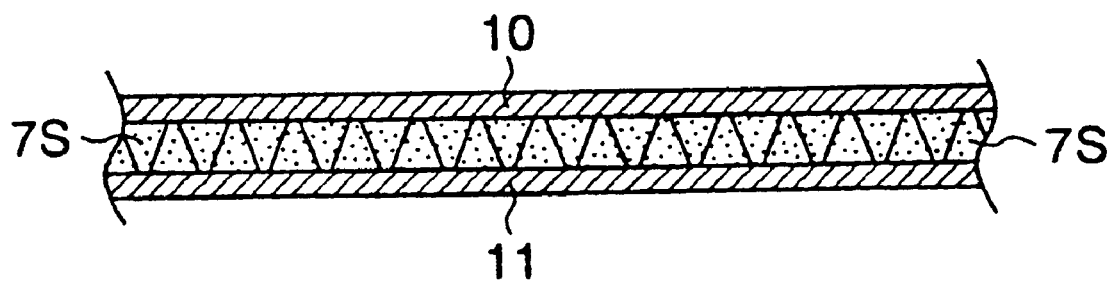

FIGS. 7A and 7B are diagrams for explaining an example of a fabrication method of a wiring board of the present invention. First, on conductor layers 10 and 11 consisting of copper foil or the like, conductive pillars 7S having an approximately conical shape are formed, respectively, by the use of screen-printing method. The conductive pillars may be formed for instance of conductive resin, conductive paste or the like. At this time, the conductive pillars 7S for interlayer connection of signal lines, the conductive pillars employed as thermal via or the like can be formed simultaneously.

Then, through a prepreg 21i of semi-cured state (B stage), the conductor layers 10 and 11 thereon conductive pillars 7S are formed are disposed to face with each other. At this time, the conductive pillars 7S formed on the conductor layers 10 and 11 are disposed themselves so as to engage to each other.

Then, the stacked body is heated while compressing. By compressing the conductive pillars 7S pierce through the softened prepreg 21i to connect with the facing conductor layer while deforming plastically. In addition, the prepreg 21i is cured to be in C stage. Accordingly, the conductive pillars formed by such a method have a layer of plastic deformation.

Thus, by forming the conductive pillars in approximate cone and by piercing the conductive pillars through the prepreg of semi-cured state, interlayer connection can be carried out. In this method, interlayer connection between a plurality of conductor layers that are stacked through insulating layers can be implemented without employing a step of boring or a step of plating. Accordingly, productivity of fabrication of wiring boards can be improved. The conductive pillars may be aligned by the use of transmission of X-rays.

Figure 8A:
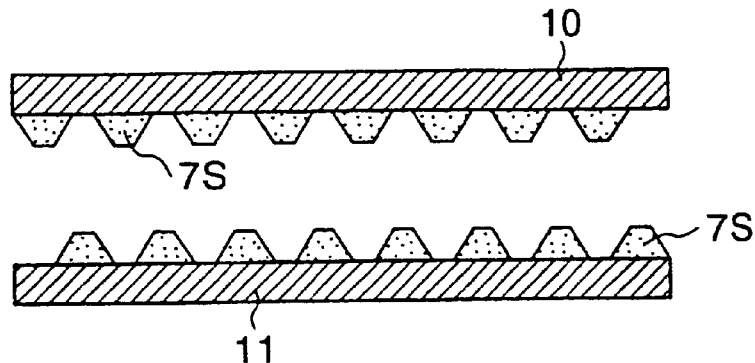
FIG. 8A, FIG. 8B and FIG. 8C are diagrams for explaining another example of a fabrication method of a wiring board of the present invention.
Figure 8B:
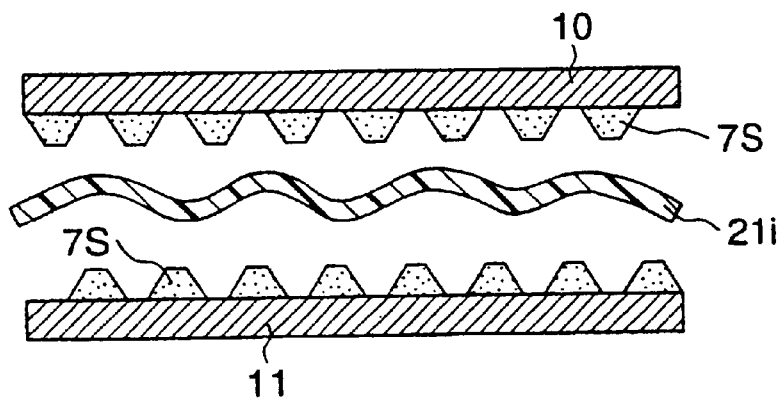
Figure 8C:
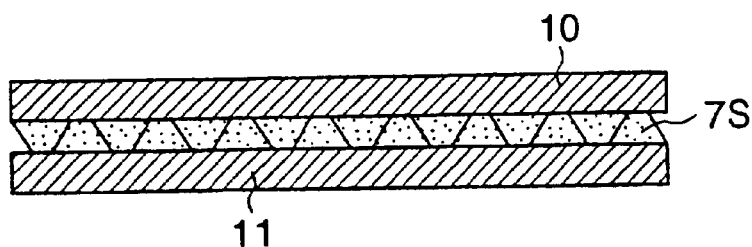

FIGS. 8A, 8B and 8C are diagrams for explaining another example of a fabrication method of the wiring boards of the present invention. Like this, sharpness of heads of conductive pillars 7S can be made small in the range allowing to pierce through the prepreg of semi-cured state. By thus implementing, contacting property when the conductive pillars engage themselves can be improved.

In the above, when the conductor layer and the insulating layer are stacked the interlayer connection is established by the use of conductive pillars. However, the present invention is not restricted to this method. For instance, though number of step increases, through holes may be formed in an insulating layer, and conductive resin may be filled in these through holes or a layer of plating is formed therein to form conductive pillars.

(Embodiment 4)

Figure 9:
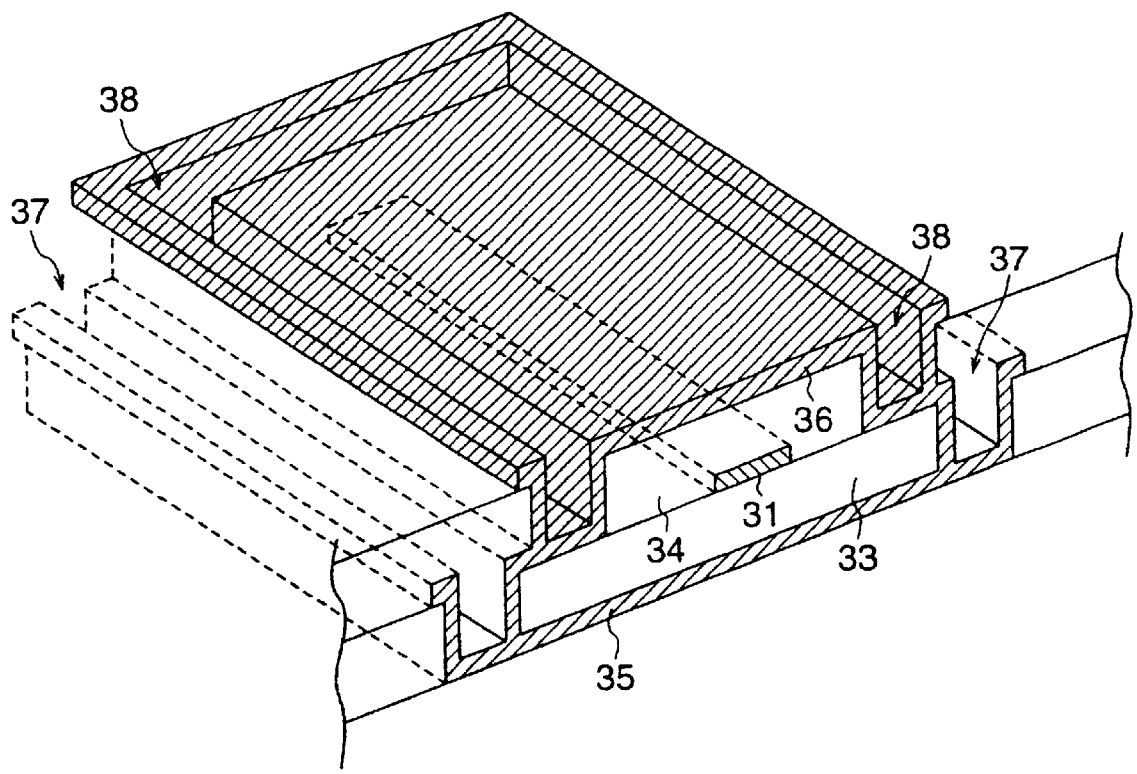
FIG. 9 and FIG. 10 are diagrams showing schematically another example of a constitution of a wiring board of the present invention.
Figure 10:
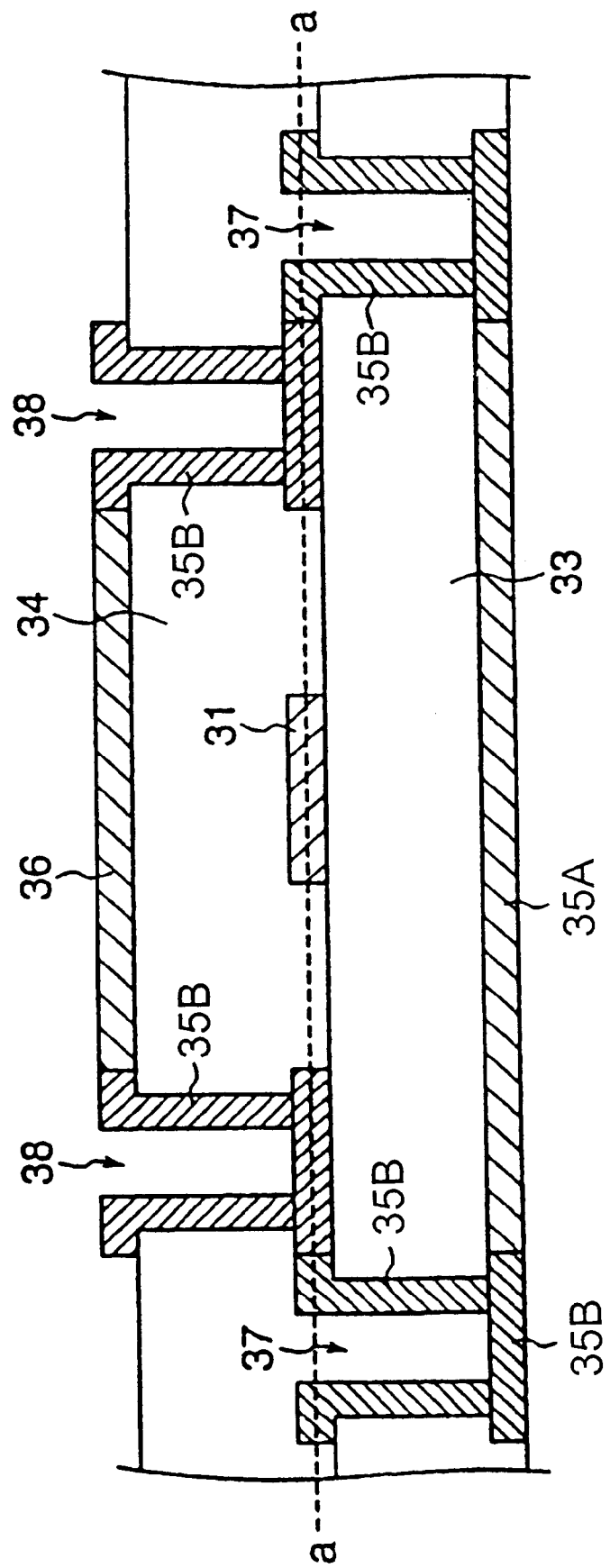

FIGS. 9 and 10 are diagrams showing schematically another example of a constitution of a wiring board of the present invention. These figures illustrate lines and shielding structures thereof.

In the wiring board, together with sandwiching line 31 by conductor layers 35A and 36 through insulating layers 33 and 34, respectively, along the line 31 groove like photo-vias 37 and 38 are disposed in the insulating layers 33 and 34, and the conductor layer 35B is formed on the surfaces of the photo-vias 37 and 38 to implement interlayer connection between the conductor layer 35A and the conductor layer 36.

In this example, the conductor layers 35 and 36 are formed by the use of electroless plating. Since the photo-vias 37 and 38 can not be formed to pile up, here two photo-vias are disposed displaced to each other. Incidentally, the width of the line 31 and the diameter of the photo-via may be different. Here, the widths of line and groove like photo-via are set in the range of approximately 0.1 mm to 0.5 mm, however such parameters can be set as demand arises.

Figure 11:
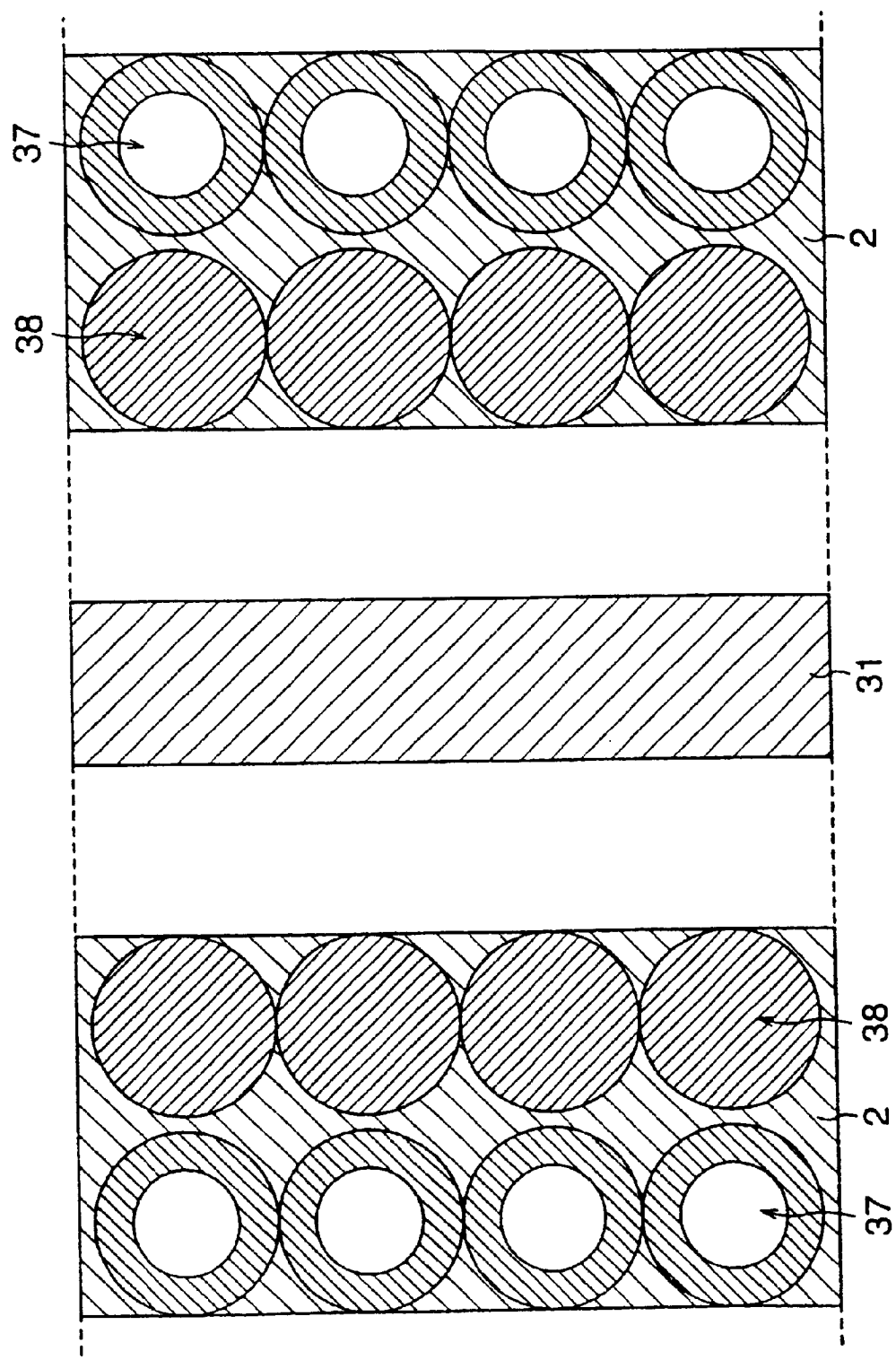
FIG. 11 is a diagram showing schematically another example of a constitution of a wiring board of the present invention.

FIG. 11 is a diagram showing schematically another example of a constitution of a wiring board of the present invention.

This figure corresponds to a cross section in aa direction in FIG. 10. Instead of grooves 37 and 38, circular photo-vias 39 are arranged along the line.

When the conventional circular photo-vias are adopted, the width of the shield pattern 2 is required to be set at approximately two times the diameter of photo-via. For instance, when the diameter of photo-via is set at 0.2 mm, the width of the shield pattern is required to be set at approximately 0.4 mm or more.

Figure 12:
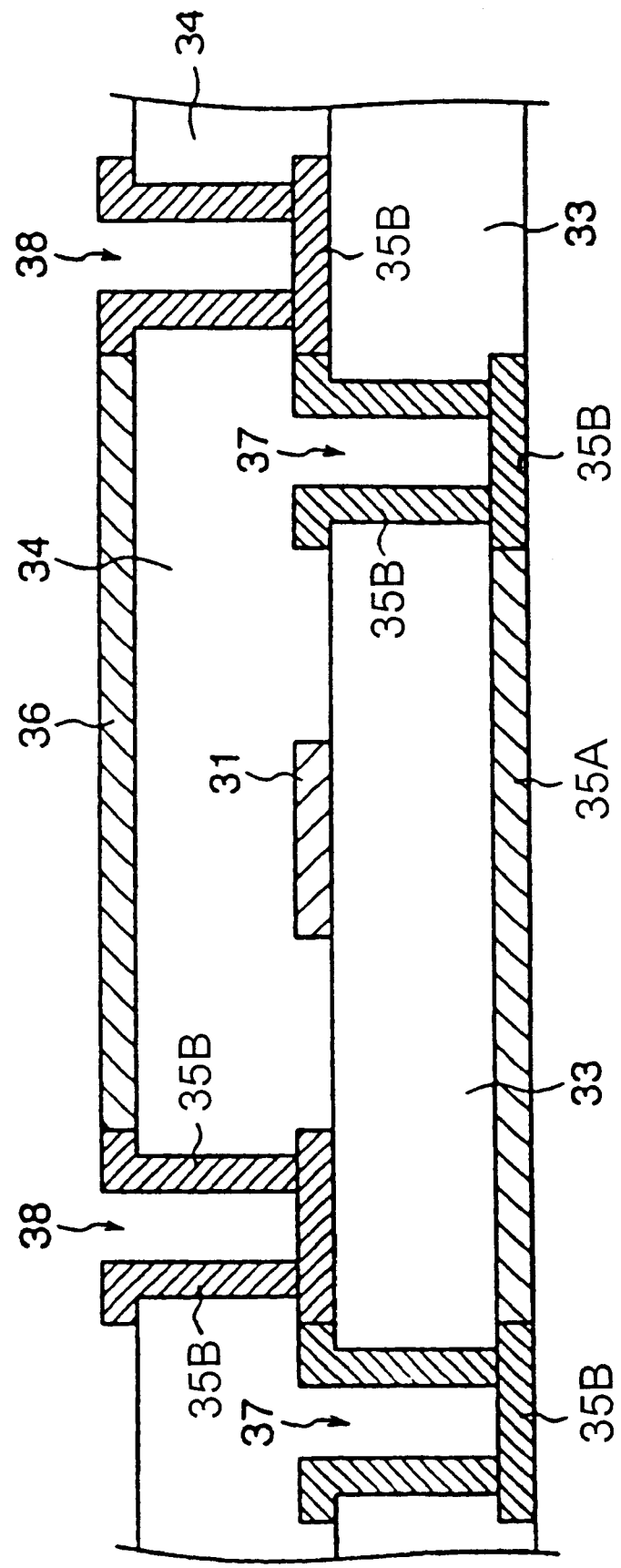
FIG. 12 is a diagram showing schematically another example of a constitution of a wiring board of the present invention.

FIG. 12 is a diagram showing schematically another example of a constitution of a wiring board of the present invention.

This example is a modification example of a wiring board of the present invention illustrated in FIGS. 9 and 10. Two steps of photo-vias 37 and 38 are displaced in different way. Also in this case, the width of shield pattern 2 is required as identical as the example of FIGS. 10 and 11.

Thus, in the wiring board of the present invention, by the conductor that connects the conductor layer 35A and the conductor layer 36 the line 31 can be shielded.

Figure 13:
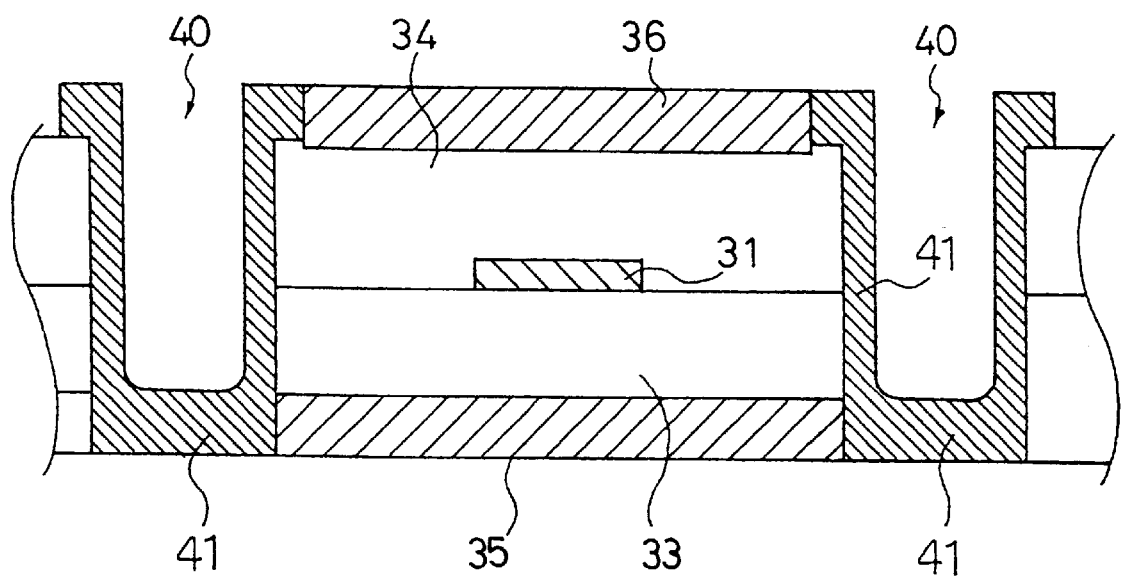
FIG. 13 is a diagram showing schematically still another example of a constitution of a wiring board of the present invention.

FIG. 13 is a diagram showing schematically still another example of a constitution of a wiring board of the present invention.

In this example, photo-vias 40 are formed pierced through the insulating layers 33 and 34, and on an inner surface of the photo-vias 40 a conductor layer 41 is disposed by the use of electroless plating.

By adopting such a constitution, the width of the shield pattern 2 can be made small. Accordingly, shielding structure of the line 31 can be made compact.

(Embodiment 5)

As described above, according to the wiring board of the present invention, the lines of inner layers of the wiring board can be shielded almost completely. Accordingly, if part thereof is not shielded deliberately, this portion of the line where the line is not shielded can be employed as an antenna.

Figure 14:
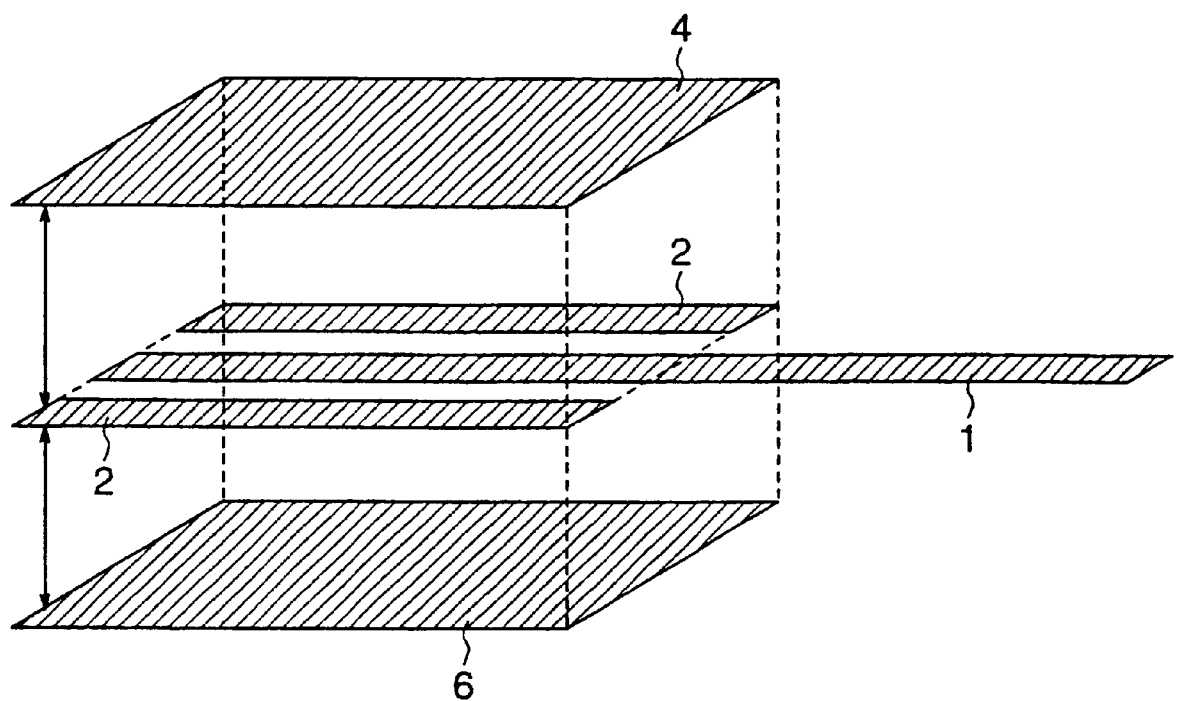
FIG. 14 and FIG. 15 are diagrams showing schematically an example of a structure of a wiring board of the present invention that is provided with such an antenna.
Figure 15:
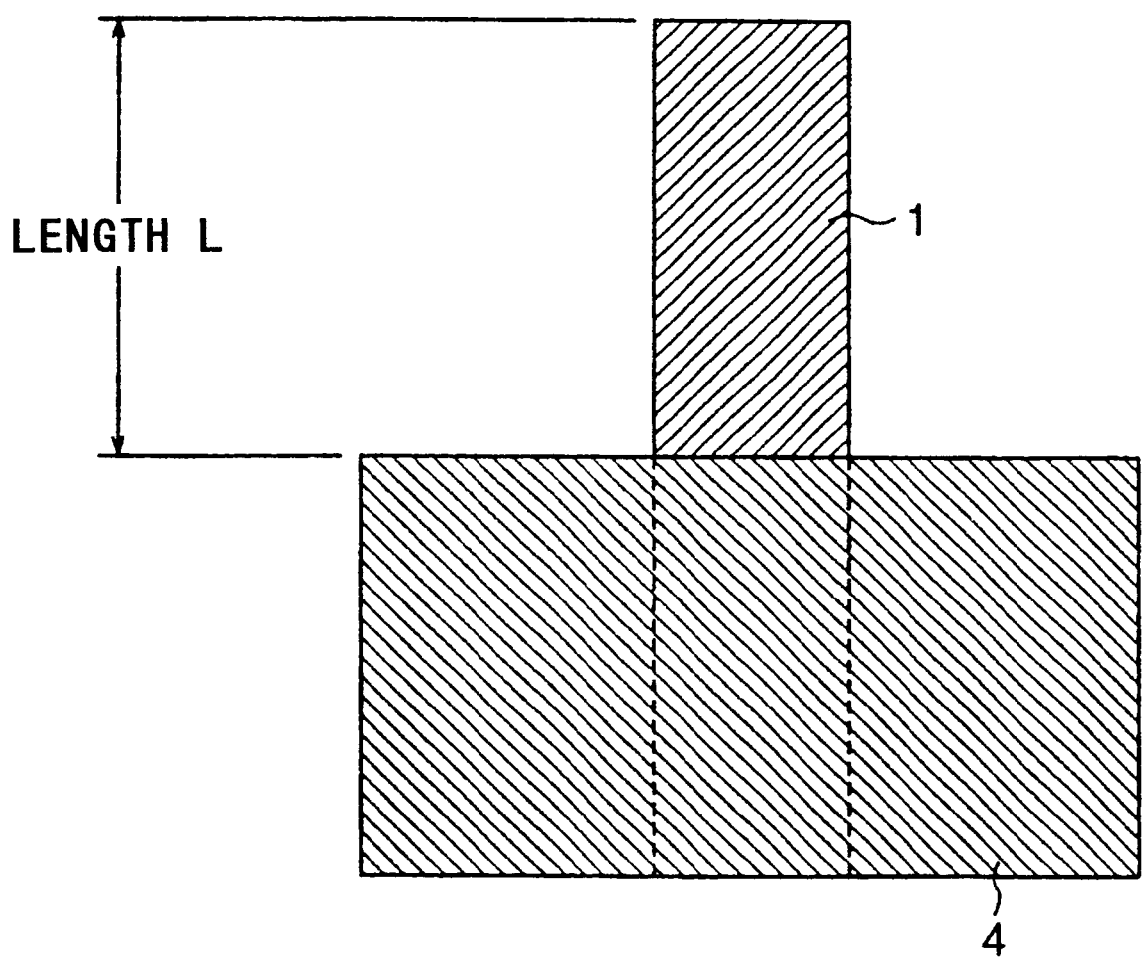

FIGS. 14 and 15 are diagrams showing diagrammatically an example of a structure of a wiring board of the present invention provided with such an antenna.

Omitted from showing in the figure for simplicity, interlayer connection between the conductor layers 4 and 6 is implemented by for instance the conductive pillar 7S, shield patterns 2, or photo-vias all of which are not shown in the figure. Accordingly, in this area, the line 1 is shielded three dimensionally.

By contrast, other portion of the line 1 is not shielded, and by adjusting the length L of this portion according to wavelength of electromagnetic wave (for instance $\lambda/4$, $\lambda/2$, $5\lambda/8$, $3/4\lambda$ and so on) it can be employed as an antenna. In this case, analogue signal travels along the line.

By adopting such a constitution, within the wiring board an antenna can be incorporated. Pulling around of pattern of an oscillator can be implemented easily. In particular, by applying the wiring board of the present invention to various kinds of vehicular communication terminals such as cellular phones, PHSs or the like, the communication terminals can be made small and light.

(Embodiment 6)

Figure 16:
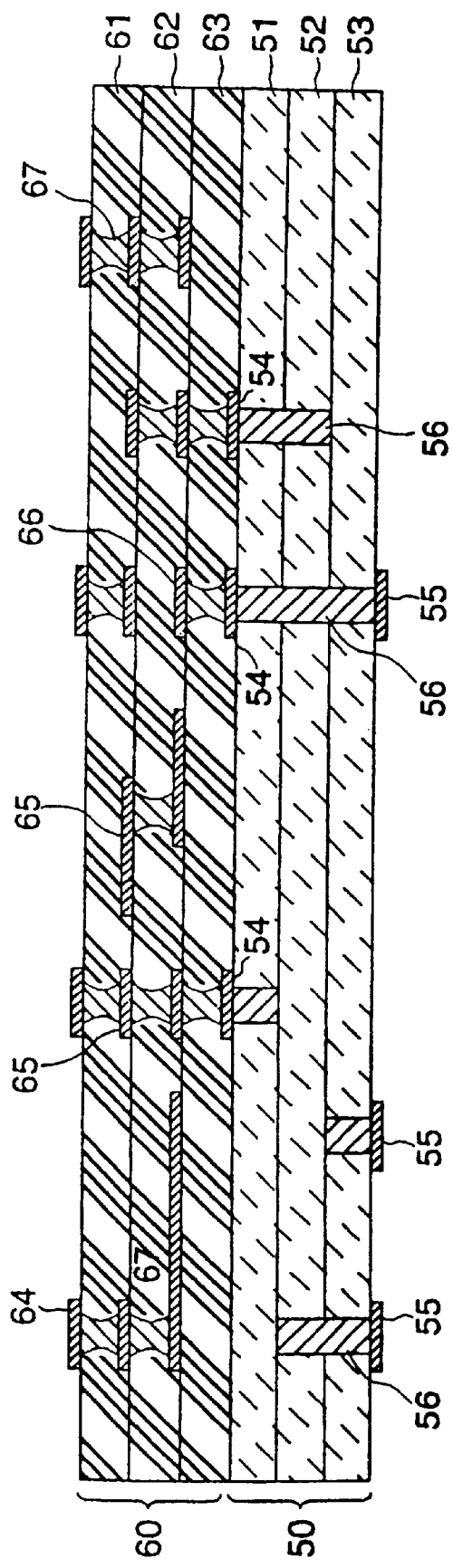
FIG. 16 is a diagram showing schematically an example of a structure of a wiring board of the present invention.

FIG. 16 is a diagram showing schematically an example of a constitution of a wiring board of the present invention.

This wiring board is a multi-layered wiring board in which a plurality of wiring layers is stacked through insulating layers. As the insulating layer, the first insulating layers 51, 52 and 53 constituted of ceramic material and the second insulating layers 61, 62 and 63 constituted of resin material such as prepreg or the like are employed in combination. That is, this wiring board is a composite of ceramic base material 50 and resin base material 60. In this example, three layers of the first insulating layer consisting of alumina and the second insulating layer consisting of prepreg in which glass cloth is impregnated by glass epoxy based resin are stacked, respectively. In the wiring layer consisting of resin base material, copper foil or the like is patterned to form such as transmission line, via-land, shield pattern or the like.

Ceramic base material 50 is co-fired to form and a plurality of wiring layers including wiring layers 54 and 55 is connected by the use of interlayer connection vias 56 consisting of for instance Mo, W or the like.

Figure 17:
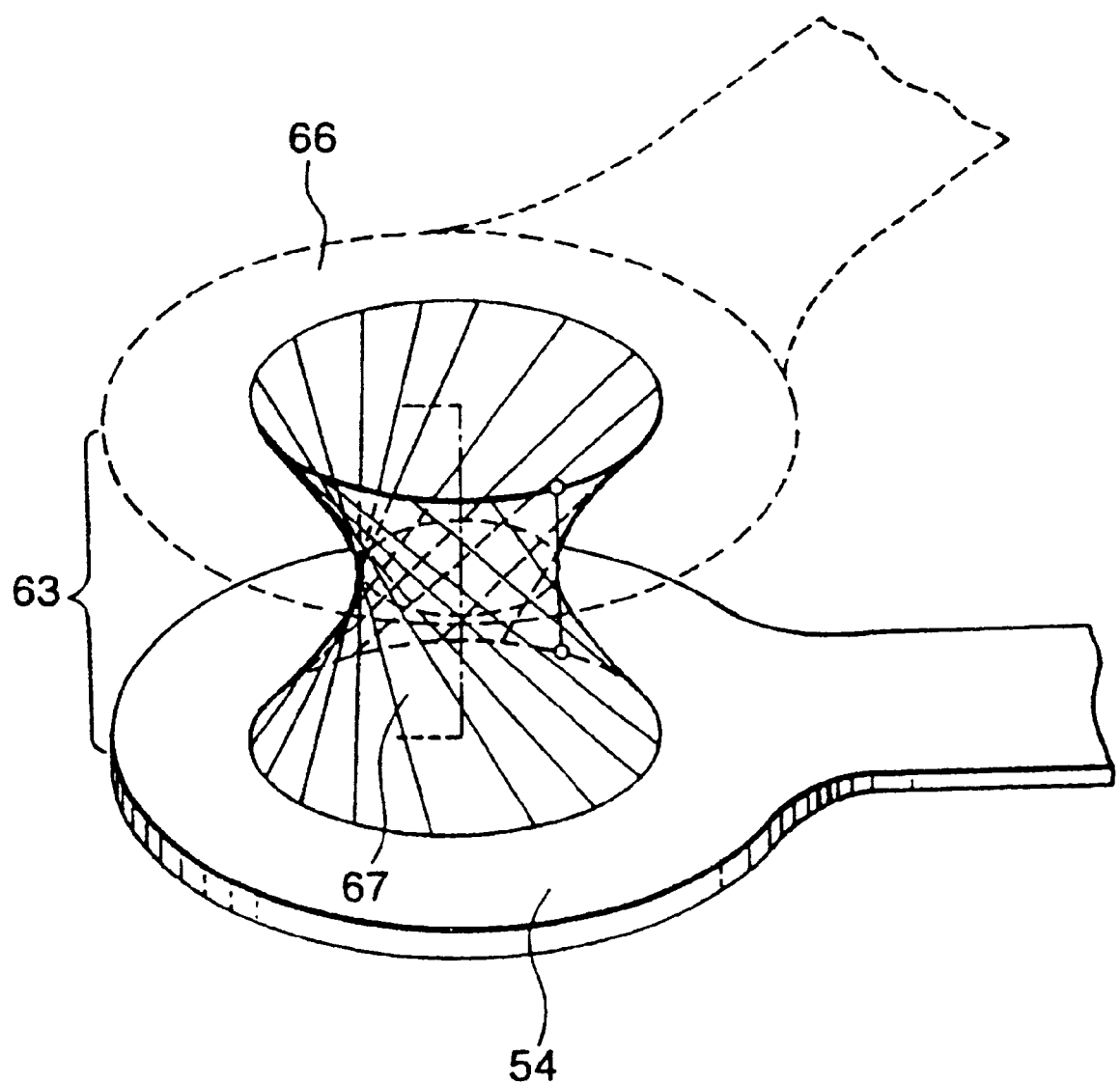
FIG. 17 is a diagram showing schematically an example of a structure of a conductive pillar.

In contrast, wiring layers 64, 65 and 66 of resin base material 60, and wiring layer 54 and wiring layer 66 are connected therebetween by conductive pillars 67 consisting of conductive resin. FIG. 17 is a diagram showing schematically an example of a structure of the conductive pillar 67.

This conductive pillar 67 carries out interlayer connection between a plurality of wiring layers by piercing through the second insulating layers 61, 62 and 63.

Figure 18:
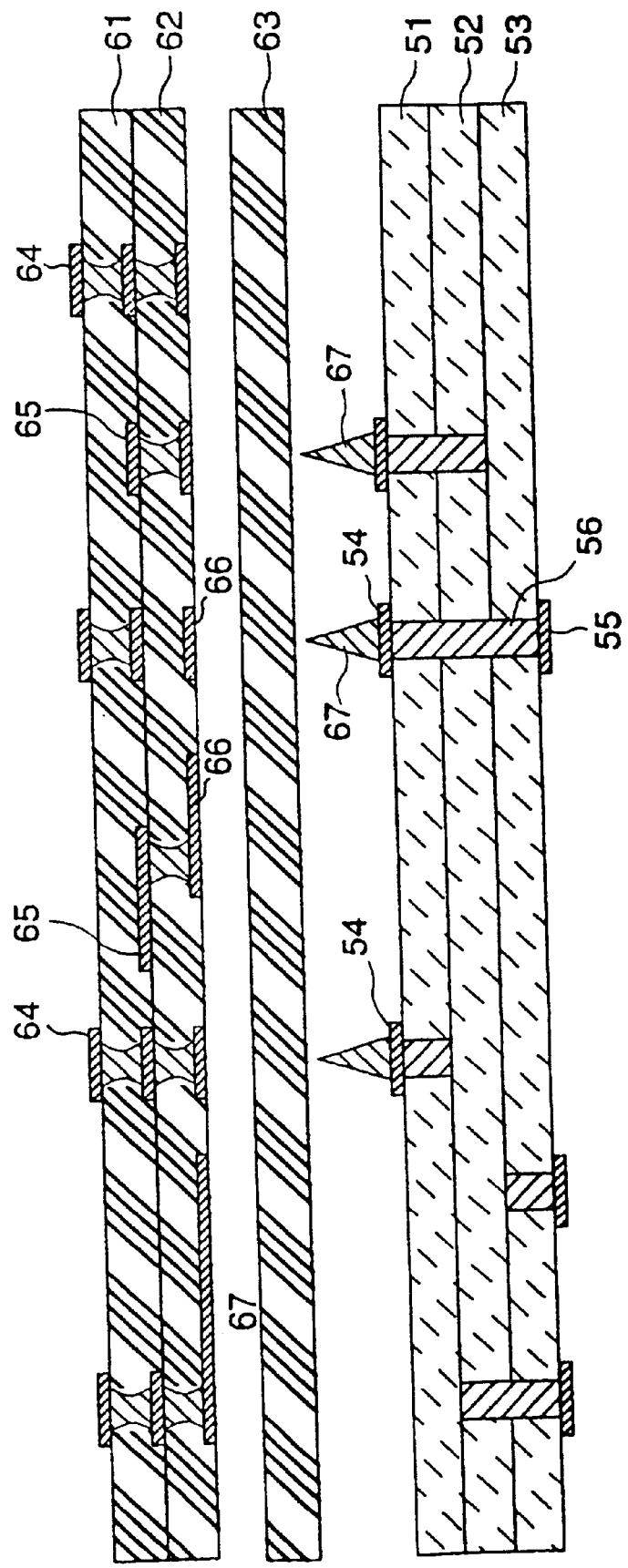
FIG. 18 is a diagram for explaining an example of a fabrication method of a wiring board of the present invention.

FIG. 18 is a diagram for explaining an example of a fabrication method of a wiring board of the present invention.

For instance, first on wiring layers 54 consisting of ceramic base material 50 conductive pillars 67 of approximate cone are formed by the use of screen-printing method.

Then, so that the formed conductive pillars 67 and wiring layers 66 face to each other, resin base material and ceramic base material are disposed through the second insulating layer 63 of semi-cured state.

Then, while heating the second insulating layer 63 to soften, the ceramic base material and the resin base material are pressed together. At this time, the conductive pillars 67 pierce through the softened second insulating layer 63 to connect with the wiring layer 66 while showing plastic deformation. The second insulating layer 63 that was in semi-cured state is heated to cure to be C-stage.

So far, when interlayer connection due to such conductive pillars 67 is implemented, for instance resin layers 62 and 61 of C-stage are softened fully due to heating and compression to result in deformation of the wiring layers 65 and 66. In addition, there are problems that due to such deformation, reliability of interlayer connection is deteriorated, and productivity of the wiring boards is lowered.

In wiring board of the present invention, hardness of ceramic base material is designed to be larger than that of the resin layer. Accordingly, even when the second insulating layer is stacked on the base material to attain a multi-layered wiring board, such a wiring layer can be prevented from deforming. That is, since the ceramic material is enough hard compared with organic resin material, even during stacking step, deformation due to conductive pillars does not occur. Accordingly, such a high reliability of connection that interlayer connection resistance is always several m$\Omega$ or less can be realized. Further, since there is allowance in stacking conditions, productivity can be improved.

For instance, since hardness of ceramic base material 50 is larger than that of resin, upon compressing uniform pressure can be applied on a surface of the base material. Accordingly, reliability of interlayer connection can be improved. In addition, productivity of wiring boards can be improved.

Further, so far, when multi-layered wiring boards are tried to fabricate with only insulating layers mainly consisting of resin material such as prepreg, insulating layer of base material destined to be a core (or base) is required to be thick, or softening temperature is required to raise. Further, in order to improve connection reliability, to the thickness of the insulating layer to be formed on the base material destined to be a core the diameter of the conductive pillar is necessary to be made larger.

In contrast, in the wiring board of the present invention, by adopting ceramic material of larger hardness at least in part of the insulating layer, reliability of interlayer connection due to conductive pillars can be improved. Thereby, the thickness of the second insulating layer consisting of resin can be made thinner, and the diameter of the conductive pillar can be made smaller. Accordingly, thin wiring board capable of coping with packaging of high density can be provided.

Further, the ceramic board has a property that it is large in hardness but is brittle. In the wiring board of the present invention, the resin base material plays a role of cushion to the ceramic base material to result in protection of the ceramic base material.

Incidentally, present inventor has found that hardness of the insulating layer destined to be a core base material is only necessary to be approximately 3 or more by Mohs scale, or approximately 200 or more by Vickers hardness scale. In general, hardness of ceramics is approximately 650 or more by Vickers hardness scale, and that of alumina or the like is approximately 1600. In addition, hardness of each of copper, iron and glass is approximately 3, approximately 5 to 7, and approximately 4.5, respectively. All of them can be employed as the first insulating layer of the wiring board of the present invention.

(Embodiment 7)

Figure 19:
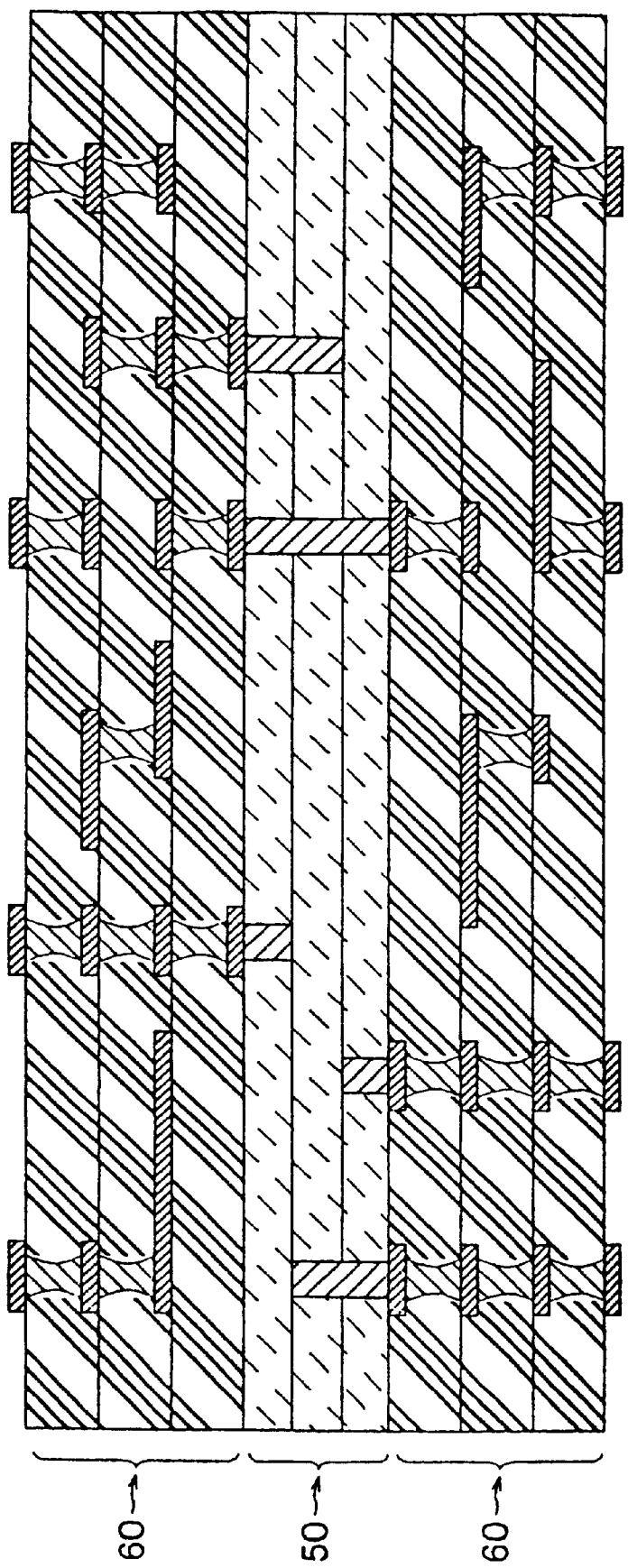
FIG. 19 is a diagram showing schematically another example of a constitution of a wiring board of the present invention.

FIG. 19 is a diagram showing schematically another example of a constitution of a wiring board of the present invention.

In an example of FIG. 16, whereas a constitution in which only on one surface of ceramic base material 50 resin base material 60 is disposed is shown, in this example on both surfaces of ceramic base material 50 resin base material 60 is disposed. Even in such a case, since the wiring board of the present invention employs a layer of base material of high hardness and high stiffness for a base or a core, uniform compression can be exerted on the whole base material, resulting in wiring board of high reliability.

Since ceramics is a sintered body, how carefully it is polished, there are fine holes and unevenness remained on its surface. When a thin film is stacked on this ceramics, such holes and unevenness are necessary to be filled in. In the wiring board of the present invention, resin material of semi-cured state automatically fills in the unevenness and holes on the surface of the ceramics to result in improvement of productivity. Further, due to anchoring effect of the resin layer to the unevenness of the surface of ceramics, a plurality of insulating layers can join themselves strongly.

In this embodiment, as the base material destined to be a base or a core thereon resin base material is stacked ceramic material is employed for insulating layer. The wiring board of the present invention is not restricted to this, but any material having hardness larger than that of resin material can be employed. As such material, for instance, glass and metallic plate, metallic plate having insulating layer on the surface thereof or the like can be cited.

In the wiring board of the present invention, the base material is composed of material of high stiffness such as ceramics. Accordingly, stacking on both surfaces thereof does not deform the lines within the base material of inner layer. Accordingly, a wiring board consisting of a number of layers can be easily formed. By contrast, the wiring board due to the present invention is not restricted to the aforementioned embodiments and can be modified variously in the range that does not depart from the scope of the present invention. First, in the embodiment a co-fired ceramic board is employed, however ceramic base material, laminated ceramic board, glass-ceramic base material, glass base material, metal, metal base board or the like can be employed. This is because by employing base material of higher hardness than that of organic resin to be stacked, the wiring board of the present invention can be constituted of.

As described above, in the wiring boards involving the present invention, hardness of the base material is fundamentally higher than that of the material to be stacked on. Accordingly, in stacking, the base material or the material to be stacked on does not deform unnecessarily. Therefore, connection reliability therebetween due to connecting vias is high. Accordingly, there is allowance in stacking conditions and the wiring boards involving the present invention can cope with mass-production.

Further, when ceramics is employed for the base material, the following effect can be newly expected. Since the ceramic board is easy in multiple stacking of wiring, within the base material wiring layers can be formed. Though the pitch is more rough (approximately 0.2 mm) than that of line of wiring layer (approximately 0.1 mm) formed on organic material to be stacked, a wiring layer of multi-layers can be easily formed. Accordingly, only the portion where fine patterning of wiring is necessary needs only be formed in organic material portion to be stacked on. In contrast, in recent years as a semiconductor device operates with a higher and higher speed, power consumption increases to arouse a necessity to strengthen the wiring of power system. By constituting a plastered pattern layer of power source system in the base material of ceramics, extremely stable power supply to a semiconductor device can be carried out. In addition, ceramic base material, being hard, is not weak to bending as the conventional printed wiring board. That is, since the ceramics itself can be a supporter, even if the surface of a board is large, reliability thereof is extremely high. Accordingly, it is effective as a packaging board of larger area. In contrast, compared with a wiring board consisting of ceramic base material alone, because of stacking of organic material the weak point of ceramics, that is, brittleness can be overcome through a role of cushion of organic material.

Further, when a metallic plate is employed for the base material, the following new effect can be expected. As recent year higher speed operation of semiconductor advances, heat generation from semiconductor devices is a very important problem. The existing printed wiring board, being constituted basically of organic material, is poor in thermal conductivity. A heat sink is directly attached to a package of a semiconductor device accordingly, thus the height of the heat sink disturbs a system instrument from being small. In addition, due to packaging of the heat sink an area for packaging is frequently likely to be restricted. In the present invention, by the use of base material having a metallic plate therewith, the heat can be released from the wiring board to the outside thereof. Interlayer connection of organic material portions to be stacked is implemented by the use of vias that are filled by paste of conductive material. These vias can be employed as not only electrical interlayer connection but also as thermal vias. Thereby, thermal path from a semiconductor device to a metallic plate that is a base material can be secured to constitute a wiring board of excellent thermal conductivity. In addition, the metallic plate can be extended out of the conventional area of a wiring board to employ as a heat spreader. As to heat dissipation, heat flow from the heat source and thermal diffusion to the exterior are important. A structure concurrently having the heat flow capacity and the heat diffusion capacity can be easily constituted. That is, as a fabricating process of a wiring board, with a metallic plate on part of which a heat sink is formed as a base material, a wiring layer consisting of organic material involving the present invention is stacked thereon to form a wiring board easily. Further, such a metallic plate can be processed variously in the portion other than the portion of the wiring layer to add further function such as casing and supporter other than the wiring board alone.

(Embodiment 8)

Figure 20:
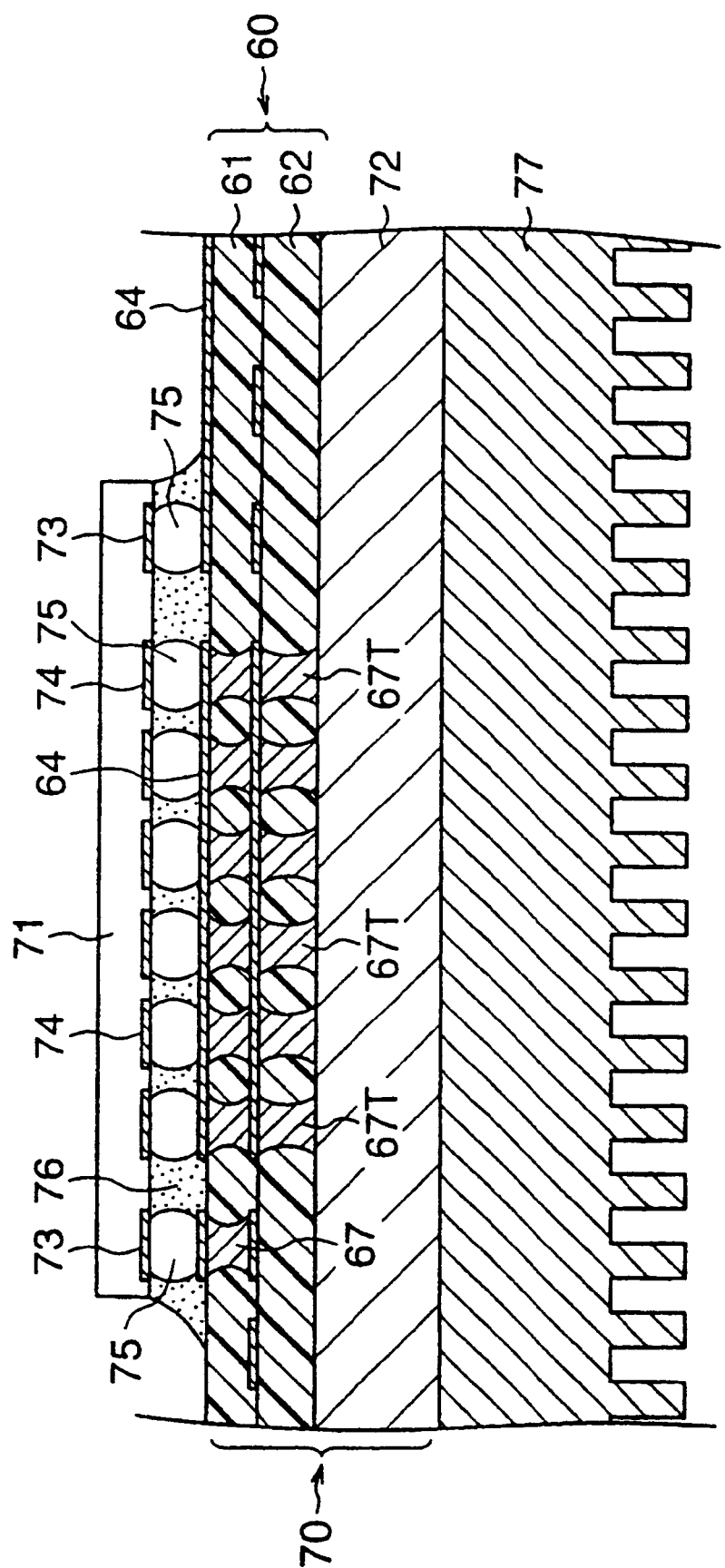
FIG. 20, FIG. 21, FIG. 22, FIG. 23, FIG. 24 and FIG. 25 are diagrams showing schematically examples of constitution of semiconductor packages of the present invention.

FIG. 20 is a diagram showing schematically an example of a constitution of a semiconductor package of the present invention.

The semiconductor package is constituted by packaging a semiconductor element 71 in facedown bonding on the aforementioned wiring board 70 of the present invention.

The wiring board 70 is one that stacks base material 72 and resin base material 60. The semiconductor element has terminals 73 for signal, power source or the like and dummy terminals 74 for heat dissipation, and both of them are connected with solder bumps 75 to wiring layers 64 on a surface of the wiring board 70. Further, gap between the semiconductor element 71 and the wiring board 70 is sealed and protected by sealing resin 76 such as epoxy based resin or the like.

Further, interlayer connection between wiring layers of the resin base material 60 is implemented by the conductive pillars 67 as identical as in the above, however portions connected to the dummy terminals 74 for heat dissipation are employed as thermal vias 67T. The thermal vias 67T are thermally connected to a metallic plate 72 such as copper or the like that is a base layer to dissipate effectively the heat generated by the semiconductor element 71. In addition, on the other surface of the metallic plate 72, a heat sink 77 is disposed to improve heat dissipation efficiency.

In the semiconductor package of the present invention, for part of a wiring board thereon a semiconductor device is packaged, base material such as metal, ceramics or the like of hardness larger than that of resin base material is adopted. Thereby, in addition to improvement of reliability of interlayer connection, productivity of wiring boards can be improved. Still further, ceramic material such as aluminum nitride or the like and metallic material such as copper or the like have larger thermal conductivity capable of dissipating effectively the heat generated due to operation of the semiconductor element.

Figure 21:
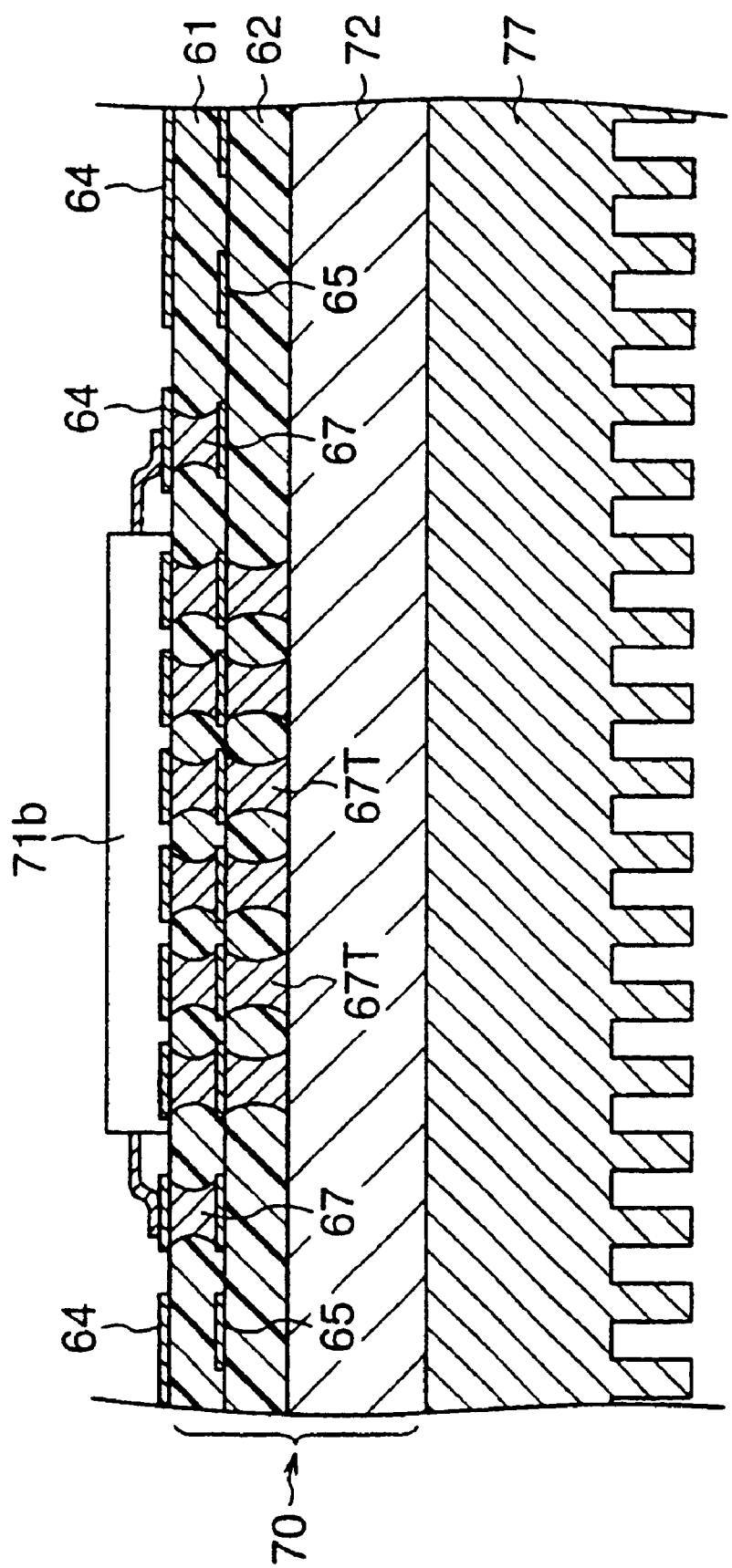

FIG. 21 is a diagram showing schematically another example of a constitution of a semiconductor package of the present invention.

In this example, in the place of a semiconductor element 71 of bare chip state, a semiconductor package 71b sealed by mold resin or ceramic package is packaged. Thus, the thermal vias 67T can be employed as effectively even for thermal dissipation of heat generated by a sealed semiconductor package.

Figure 22:
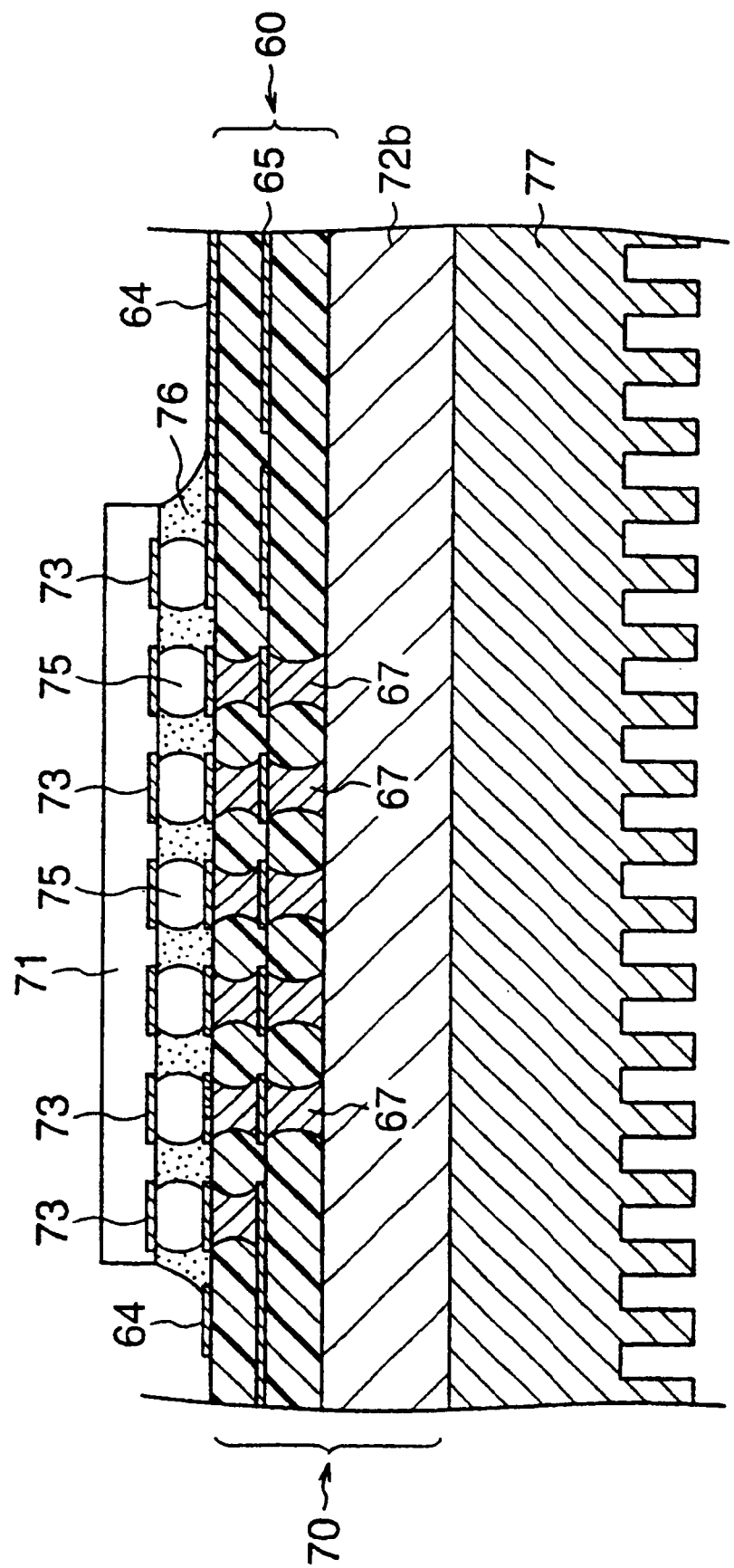

FIG. 22 is a diagram showing schematically an example of still another constitution of a semiconductor package of the present invention.

In this semiconductor package, on a semiconductor element, terminals for electrical connection are arranged in lattice of two dimensions. In addition, in this example, as the base material 72 a board at least a surface of which shows insulating property such as ceramics, glass, or metallic plate provided with a thin insulating layer (approximately 100 μm or less) on a surface thereof is employed.

Thus, by pushing the conductive pillars 67 to the base material 72 of larger hardness, insulation between signal terminals 73 themselves can be secured. Further, through the conductive pillars 67, heat from a semiconductor element can be dissipated.

Figure 23:
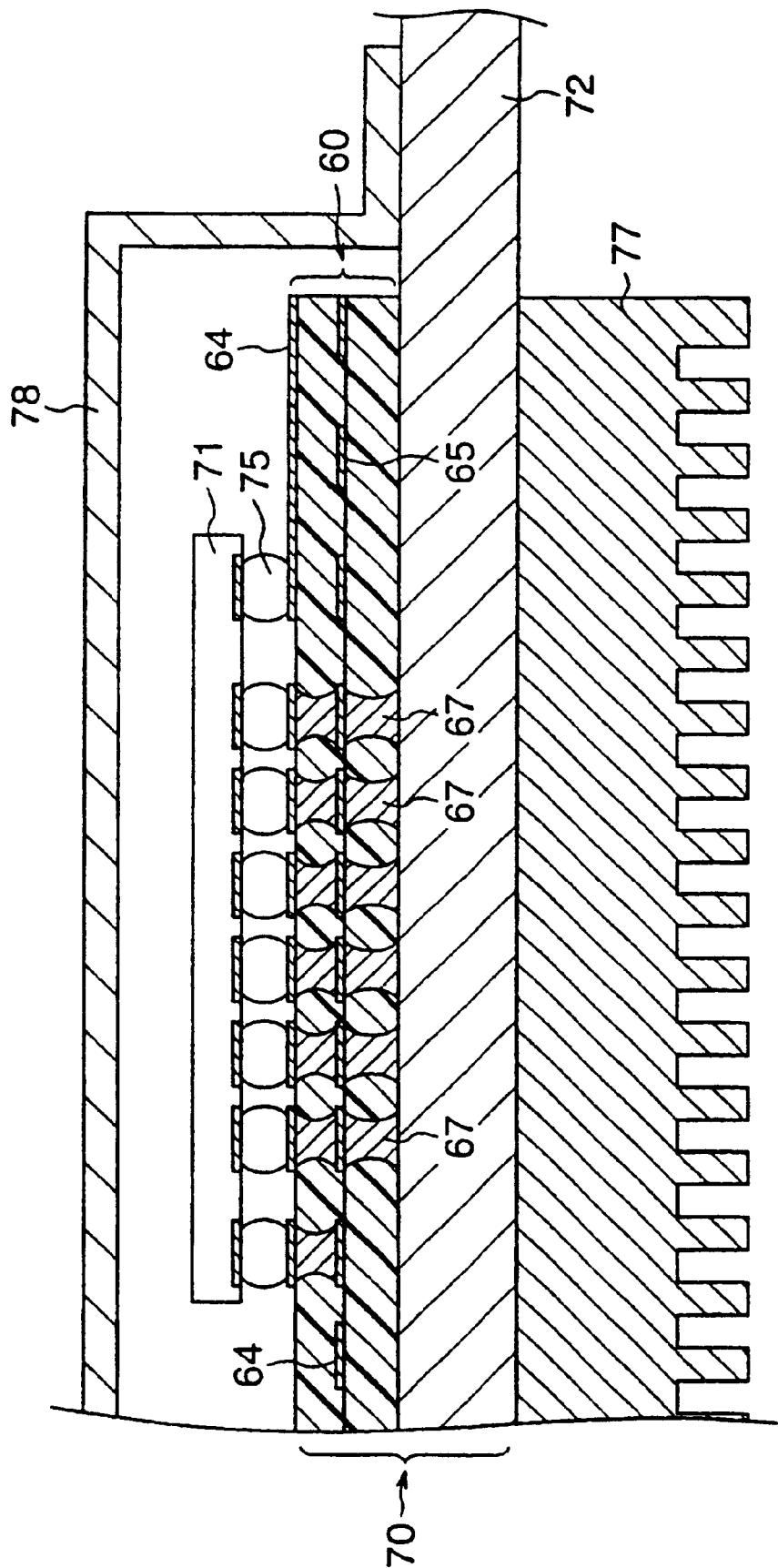

FIG. 23 is a diagram showing schematically another example of a constitution of a semiconductor package of the present invention.

This semiconductor package is a multi-chip module. A semiconductor element 71 packaged on a wiring board 70 is sealed air-tightly by a metal cap 78. In the semiconductor package of the present invention, as the base material 72 material of larger hardness is selected to employ. Thereby, the metal cap 78 can be formed on the base material 72.

Figure 24:
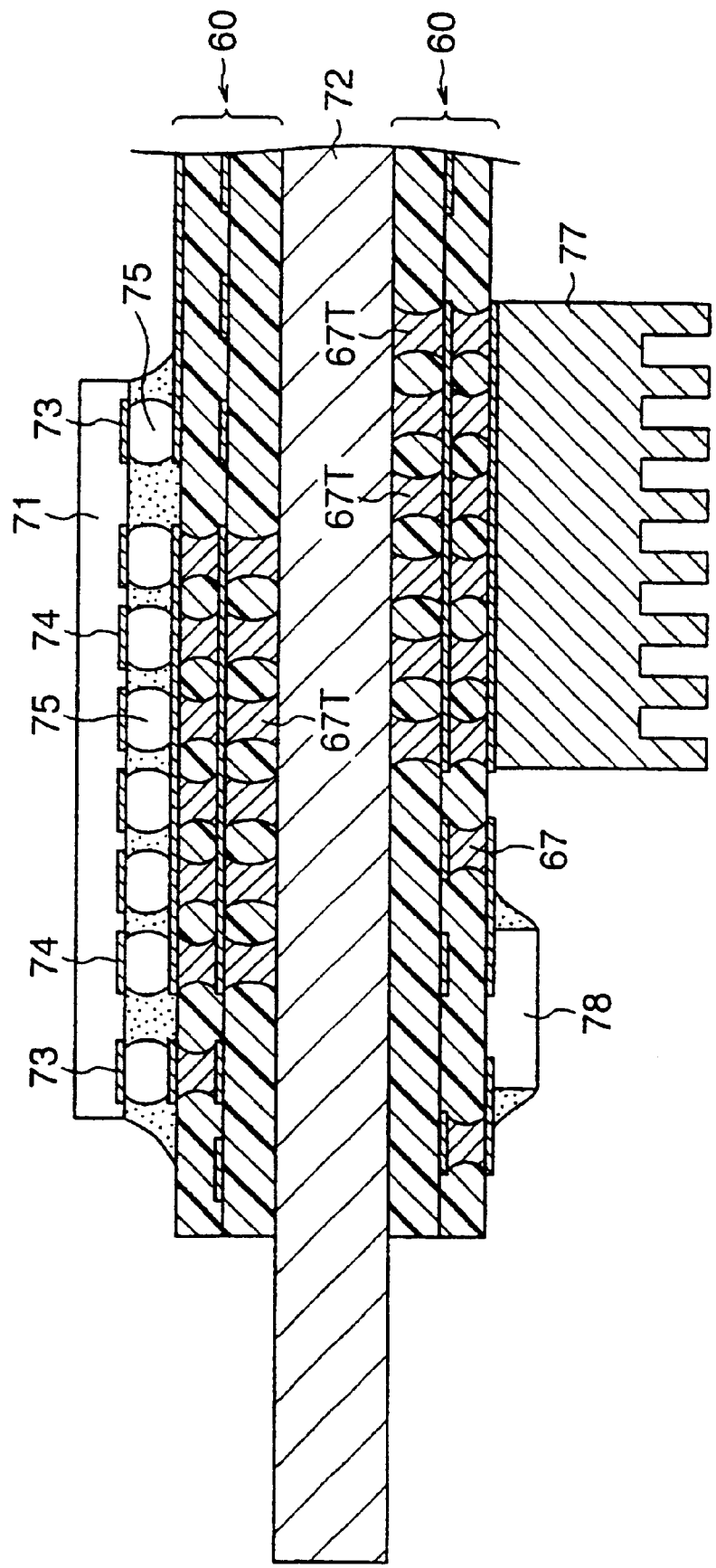

FIG. 24 is a diagram showing schematically another example of a constitution of a semiconductor package of the present invention.

In this semiconductor package, on both of surfaces of the base material 72 such as ceramic base material, metallic plate or the like, resin base material is disposed and electronic parts are packaged. In this example, on the opposite side of the semiconductor element 71 a chip condenser 78 is packaged as an electronic component. The chip condenser is packaged on the wiring board by solder, conductive resin or the like.

A wiring board of the present invention has a base material 72 of larger thermal conductivity, accordingly a heat sink 77 can be disposed displaced from a position facing to a semiconductor element 71. Accordingly, degree of freedom of design of a semiconductor package can be improved.

Figure 25:
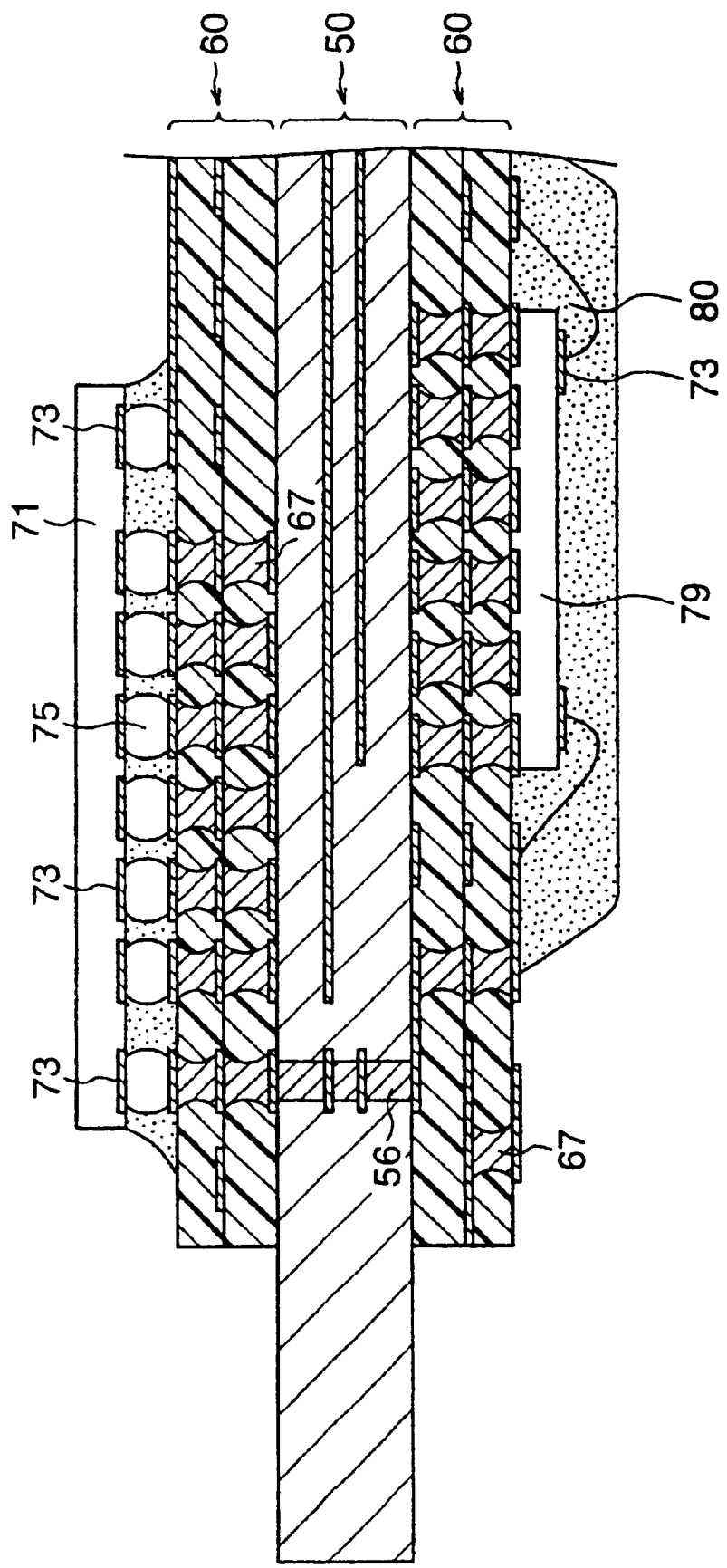
Figure 26:
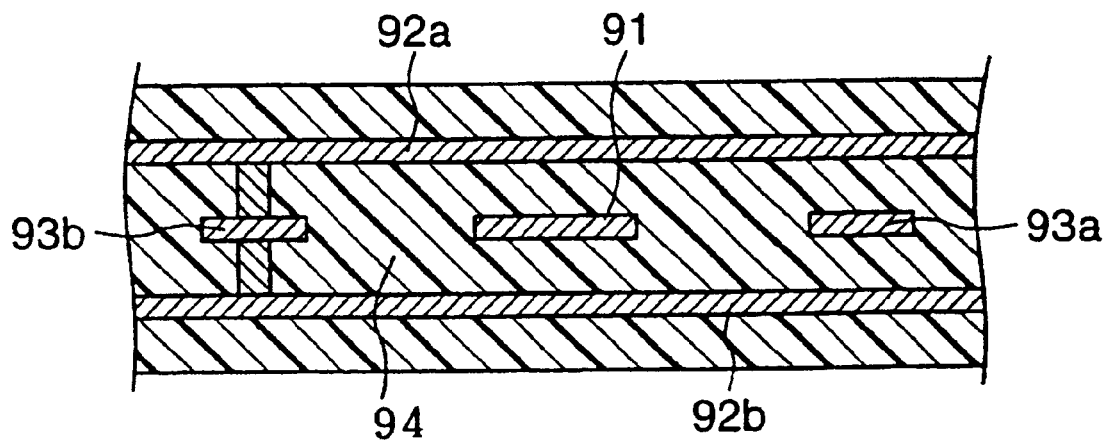
FIG. 26 and FIG. 27 are diagrams showing examples of constitution of conventional wiring board.
Figure 27:
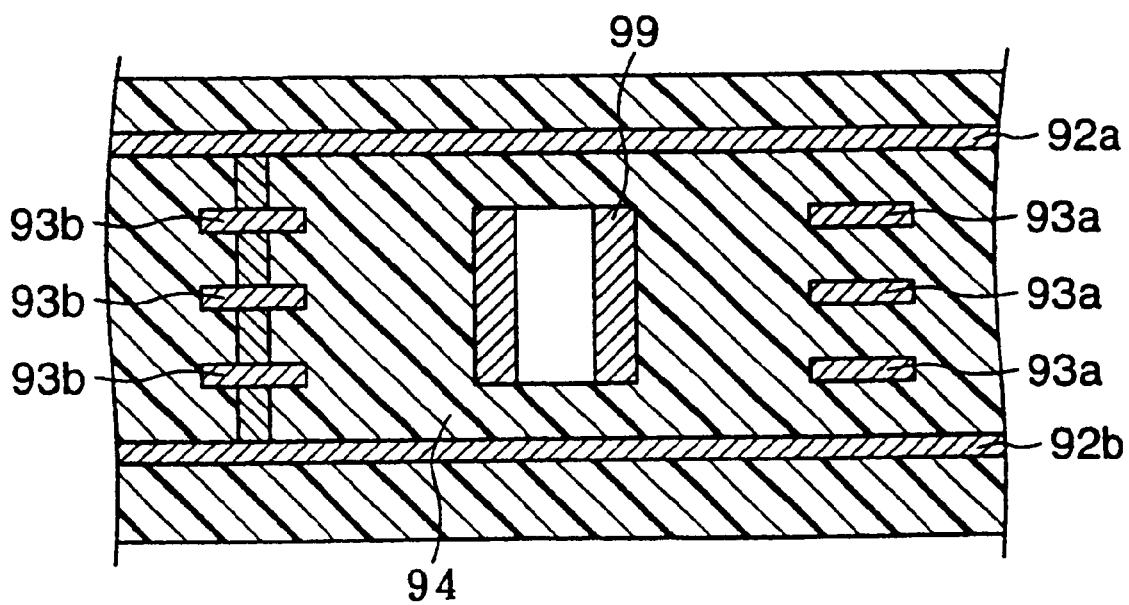

FIG. 25 is a diagram showing schematically still another example of a constitution of a semiconductor package of the present invention.

In this example, a wiring board is employed in which on both surfaces of the ceramic base material 50 resin base materials 60 are stacked. By adopting such a constitution, both sides of the wiring board can be connected. Further, on the ceramic base material 50, common power source plane, ground plane or the like may be disposed.

Further in this example, on the opposite side of the semiconductor element 71, another semiconductor element 79 is packaged. This semiconductor element 79 is connected to a wiring board by a bonding wire 80. Thus, in a semiconductor package of the present invention, method of packaging a semiconductor element and various kinds of electronic parts may be selected according to demand.

Thus, in addition to adoption of a base material of larger hardness than resin layer such as prepreg as a base material or a core material, by applying a wiring board of the present invention in which conductive pillars are employed for interlayer connection between wiring layers of the resin base material to a semiconductor package, reliability of a semiconductor package can be improved. Further, degree of freedom of design of semiconductor package can be improved.

Further, the wiring board of the present invention in which a base material of larger hardness than a resin layer is adopted as a base material or a core material may be combined with the aforementioned shielding structure of the line.

INDUSTRIAL APPLICABILITY

As described above, according to a wiring board of the present invention, the circumference of a line of a wiring layer of an inner layer of a wiring board can be effectively shielded over 360°. Thereby, an adverse effect due to unnecessary radiation from for instance the line can be prevented from adversely affecting other lines within the wiring board, electronic parts packaged on the wiring board, or the outside of the wiring board. Further, the line L is also prevented from being adversely affected by these portions.

Further, according to the wiring board of the present invention, as base material or core material, material of larger hardness than resin material, such as prepreg or the like, is adopted. Thereby, reliability of interlayer connection due to the conductive pillars can be improved. In addition, a thickness of the resin layer can be made thinner, and a diameter of the conductive pillars can be made smaller. Accordingly, a wiring board can be made thinner, and at the same time packaging density can be heightened.

A wiring board of the present invention adopts, in a multi-layered wiring board in which a plurality of wiring layers and a plurality of insulating layers are stacked, a constitution in which interlayer connection of the wiring layers that are faced through the insulating layer is implemented by conductive pillars, and at least one of the insulating layers is consisting of ceramic material.

For instance, when the wiring board of the present invention represented by a core ceramics printed wiring is compared with for instance a conventional D/C board (thin film/ceramic board), there are the following advantages.

First, how carefully the surface of ceramics is polished, there remain fine holes on the surface thereof due to sintered body. In a thin film formed by the use of sputtering method or the vapor deposition method, a thickness of each one layer is thin. Accordingly, there occurs a necessity of a step to fill unevenness of grain level on the surface of ceramics. However, in the wiring board of the present invention, due to B stage of resin such as prepreg or the like and due to stacking under pressure, the holes are filled in automatically when being stacked.

Further, when wiring layers of thin film are formed on a ceramic board, alternate stacking of one conductor layer and one insulating layer is necessary to repeat to form a multi-layered one to result in high cost. The wiring board of the present invention can be manufactured according to a conventional fabrication method of printed circuit board. Thereby, the cost can be remarkably reduced.

Further, when a wiring layer of thin film is formed on a ceramic board, only by one surface of front and rear surfaces of the ceramic base material, or only on one surface thereof, the wiring layer of thin film can be formed. In contrast, in the wiring board of the present invention, wiring layer of thin film can be formed at the same time on both of the front and rear surfaces. Accordingly, it can be easily multi-layered and productivity thereof can be improved. Furthermore, the wiring board of the present invention, base material or core material being high in their hardness, can be compressed uniformly all over the wiring board to result in high reliability of connection due to the conductive pillars. This is particularly remarkable when an area of a wiring board is large.

When compared a wiring board where a wiring layer of thin film is formed on a ceramic board and a wiring board of the present invention of their fabricating cost from such a point of view, the wiring board of the present invention can reduce the fabricating cost to from one several tenth to one several hundredth.

Next, a wiring board of the present invention and a wiring board in which flexible boards of ceramic base material are stacked will be compared.

Even if a layer to be added to base material is made a flexible wiring board and is stacked on a ceramic board of core, some connecting means is necessary. In the present invention, a ceramic layer and a flexible board can be connected through prepreg to result in high productivity.

Further, the flexible wiring board can be stacked at most only two layers or so as additional layer. In contrast, in the wiring board of the present invention, by combining prepreg and flexible board according to demand, further multi-layered one can be easily obtained.

Further, resin board such as prepreg or the like is less expensive than the flexible wiring board to result in reduction of the cost of a wiring board as a whole.

Even when compared with other build up board, if resin board is employed as core material, there is a problem of structural strength. In addition, in the present invention, by employing material of higher thermal conductivity such as ceramics, metal or the like as core material, thermal conductivity in a transverse direction also can be improved to result in uniform dissipation of heat from the wiring board as a whole.

Further, since ceramics has high permittivity, a bypass condenser that lowers impedance of power source system and makes small variation of power source can be incorporated within a core ceramic board of the wiring board of the present invention. Accordingly, the wiring board of the present invention can cope with demand for high functionality and multi-functionality.

What is claimed is:

1. A wiring board, comprising:
    a transmission line;
    two sheets of shielding plates disposed above and below the transmission line along the transmission line;
    conductive member that is disposed on both sides of the transmission line along the transmission line and connects electrically between the two sheets of shielding plates;
    wherein the conductive member has a shape in which between the two sheets of shielding plates a plurality of substantially conical conductive pillars are disposed in one row alternating each direction thereof up and down in a direction vertical to the surface of the shielding plates; and
    an insulating layer disposed between the transmission line and the shielding plates, and the conductive member.

2. The wiring board as set forth in claim 1, wherein the conductive member has a shape in which adjacent substantially conical conductive pillars contact themselves at surface portions thereof.

3. The wiring board as set forth in claim 1, wherein the conductive member has a shape in which adjacent substantially conical conductive pillars are spaced a prescribed distance apart.

4. A wiring board as set forth in claim 1,
    wherein each of the substantially conical conductive pillars neighboring in a longitudinal direction of the transmission line which alternates each direction thereof up and down.

5. A wiring board, comprising:
    a transmission line;
    two sheets of shielding plates disposed above and below the transmission line along the transmission line;
    an insulating layer disposed between the transmission line and the shielding plates; and
    conductive member that is disposed on both sides of the transmission line along the transmission line and connects electrically between the two sheets of shielding plates;
    wherein the conductive member is formed in such a way that on corresponding positions of the two sheets of shielding plates a plurality of substantially conical conductive pillars are disposed in one row, and in a state of sandwiching the insulating layer between the two sheets of shielding plates, the two sheets of shielding plates are pressed to make the substantially conical conductive pillars pierce through the insulating layer, and thereby at least between tip ends of the substantially conical conductive pillars and the shielding plate facing the tip ends are made contact.

6. The wiring board as set forth in claim 5, wherein the conductive member has a shape in which adjacent aforementioned conductive pillars contact themselves at surface portions thereof.

7. The wiring board as set forth in claim 5, wherein the conductive member has a shape in which the adjacent substantially conical pillars are spaced a prescribed distance apart.

8. A fabricating method of a wiring board, comprising the steps of:
    forming a plurality of substantially conical conductive pillars on a portion where a shield pattern of a first conductor is destined to be formed;

forming a plurality of substantially conical conductive pillars on a portion where a shield pattern of a second conductor plate is destined to be formed;

pressing while sandwiching a board intermediate between the first conductor plate and the second conductor plate to connect electrically between the first conductor plate and the second conductor plate through the substantially conical conductive pillars; and curing the board intermediate.

9. A fabricating method of a wiring board, comprising the steps of:

forming a plurality of substantially conical conductive pillars on a portion where a shield pattern of a first conductor plate is destined to be formed;

forming a plurality of substantially conical conductive pillars on a portion where a shield pattern of a second conductor plate is destined to be formed;

pressing while sandwiching a board intermediate between the first conductor plate and the second conductor plate to connect electrically the first conductor plate and the second conductor plate through the substantially conical conductive pillars;

forming a transmission line and a shield pattern on the second conductor plate;

forming a plurality of substantially conical conductive pillars on the shield pattern;

forming a plurality of substantially conical conductive pillars on a portion where a shield pattern of a third conductor plate is destined to be formed;

pressing while sandwiching a second board intermediate between the first board intermediate and the third conductor plate to electrically connect the shield pattern and the third conductor plate through the substantially conical conductive pillars; and curing the board intermediate.

10. The fabricating method as set forth in claim 9, wherein the step of forming substantially conical conductive pillars on the conductor plates is a step of disposing the substantially conical conductive pillars themselves closely.

11. The fabricating method as set forth in claim 9, wherein the step of forming substantially conical conductive pillars on the conductor plates is a step of disposing the substantially conical conductive pillars themselves a prescribed distance apart.

12. A wiring board, comprising:

a first conductor layer having a first surface and a second surface;

a second conductor layer facing the first surface of the first conductor layer through a first insulating layer;

first interconnect cavity penetrated into the first insulating layer in the thickness direction of the first insulating layer to interconnect one surface of the first insulating layer with another surface of the first insulating layer;

first interconnect layer formed onto inner surface of the first interconnect cavity;

a third conductor layer facing the second surface of the first conductor layer through a second insulating layer;

second interconnect cavity formed on the position shifted from the first interconnect cavity in a longitudinal direction of the second insulating layer, and penetrated into the second insulating layer in the thickness direction of the second insulating layer to interconnect one surface of the second insulating layer with another surface of the second insulating layer;

second interconnect layer formed onto inner surface of the second interconnect cavity and contacted with the first interconnect cavity.

13. A wiring board as set forth in claim 12, further comprising:

a first interconnect cavity and a second interconnect cavity are through-holes.

14. A wiring board, comprising:

a first board made of an insulating material, having a first hardness;

a second board stacked directly with the first board and having a second hardness smaller than the first hardness; and a conductive pillar disposed piercing the second board.

15. The wiring board as set forth in claim 14, wherein the second board is directly stacked on both surfaces of the first board.

16. The wiring board as set forth in claim 14, wherein the first board is a ceramic board and the second board is a resin board.

17. The wiring board as set forth in claim 14, wherein the first board is consisting of glass.

18. A fabricating method of a wiring board comprising:

forming a first wiring layer having a first via-land on a first surface of a first board made of an insulating material, having a first hardness;

forming on the first via-land a substantially conical conductive pillar having a third hardness smaller than the first hardness;

disposing a second board disposed on a second wiring layer having a second via-land on a first surface and having a second hardness smaller than the first hardness to face a first surface of the first board through uncured prepreg; and pressing the first board, the prepreg and the second board in thickness direction to make the conductive pillar pierce through the prepreg, thereby connecting electrically the first via-land and the second via-land.

* * * * *